(12) United States Patent
Hsu et al.

(10) Patent No.: US 10,600,812 B2
(45) Date of Patent: Mar. 24, 2020

(54) MANUFACTURING METHOD OF ARRAY SUBSTRATE

(71) Applicant: Au Optronics Corporation, Hsinchu (TW)

(72) Inventors: Wen-Yi Hsu, Taoyuan (TW); Pei-Ming Chen, New Taipei (TW); Maw-Song Chen, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/247,592

(22) Filed: Jan. 15, 2019

(65) Prior Publication Data
US 2019/0386032 A1 Dec. 19, 2019

(30) Foreign Application Priority Data
Jun. 19, 2018 (TW) .............................. 107121013 A

(51) Int. Cl.
| | | |
|---|---|---|
| *H01L 27/12* | (2006.01) | |
| *H01L 27/32* | (2006.01) | |
| *G02F 1/1343* | (2006.01) | |
| *G02F 1/1345* | (2006.01) | |

(52) U.S. Cl.
CPC ...... *H01L 27/1218* (2013.01); *G02F 1/13439* (2013.01); *G02F 1/13458* (2013.01); *H01L 27/1262* (2013.01); *H01L 27/1288* (2013.01); *H01L 27/3262* (2013.01); *H01L 27/3276* (2013.01)

(58) Field of Classification Search
None
See application file for complete search history.

(56) References Cited

U.S. PATENT DOCUMENTS

| | | | |
|---|---|---|---|
| 7,304,710 B2 * | 12/2007 | Ishige | ................... G02F 1/1345 349/149 |
| 9,581,871 B2 | 2/2017 | Hsu et al. | |
| 10,120,247 B2 | 11/2018 | Ge | |
| 10,121,986 B2 | 11/2018 | Lee et al. | |

(Continued)

FOREIGN PATENT DOCUMENTS

| | | |
|---|---|---|
| CN | 102881655 | 1/2013 |
| CN | 103472607 | 12/2013 |

(Continued)

*Primary Examiner* — Benjamin P Sandvik
(74) *Attorney, Agent, or Firm* — JCIPRNET

(57) ABSTRACT

A manufacturing method of an array substrate including following steps is provided. A plurality of scan lines are formed on a substrate having a pixel region and a fan-out region. A plurality of data lines are formed. A plurality of transistors are formed and respectively electrically connected to the corresponding scan lines and data lines. A plurality of common electrodes are formed. A plurality of pixel electrodes are formed and respectively electrically connected to the corresponding transistors. A plurality of first fan-out lines, second fan-out lines, and third fan-out lines are formed in the fan-out region. Each of the third fan-out lines includes a transparent conductive layer and an auxiliary conductive layer located on and contacting the transparent conductive layer. The third fan-out lines and the common electrodes are formed by the same photomask.

15 Claims, 21 Drawing Sheets

(56) References Cited

U.S. PATENT DOCUMENTS

| | | | |
|---|---|---|---|
| 2014/0042444 A1 | 2/2014 | Huang et al. | |
| 2014/0117320 A1* | 5/2014 | Jung | H01L 27/3276 257/40 |
| 2014/0340625 A1 | 11/2014 | Hsu et al. | |
| 2015/0263050 A1 | 9/2015 | Hsu et al. | |
| 2015/0356937 A1* | 12/2015 | Fujikawa | G02F 1/136286 345/87 |
| 2016/0181349 A1* | 6/2016 | Cho | H01L 27/3223 257/40 |
| 2017/0365808 A1 | 12/2017 | Lee et al. | |
| 2018/0059449 A1* | 3/2018 | Kim | G02F 1/1309 |
| 2018/0149900 A1 | 5/2018 | Ge | |
| 2019/0036065 A1 | 1/2019 | Lee et al. | |
| 2019/0280013 A1* | 9/2019 | Fujikawa | H01L 27/0248 |

FOREIGN PATENT DOCUMENTS

| | | |
|---|---|---|
| CN | 103972245 | 8/2014 |
| CN | 104950490 | 9/2015 |
| CN | 105633016 | 6/2016 |
| CN | 107527935 | 12/2017 |
| TW | 201024874 | 7/2010 |

* cited by examiner

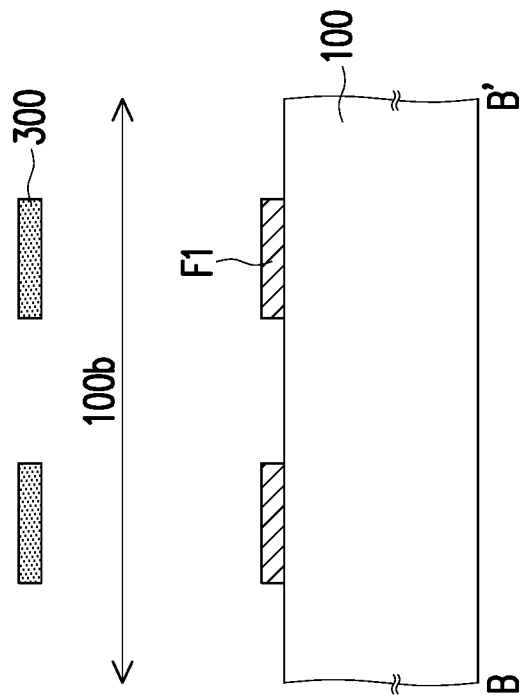
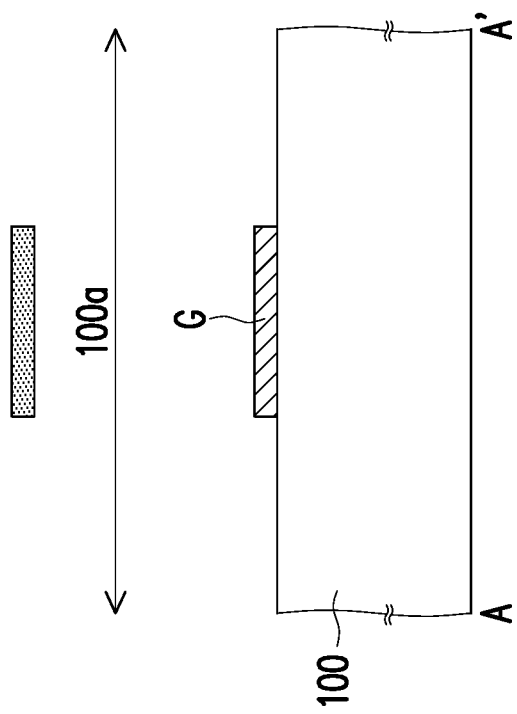
FIG. 1A

MANUFACTURING METHOD OF ARRAY SUBSTRATE

CROSS REFERENCE TO RELATED APPLICATION

This application claims the priority benefit of Taiwan application serial no. 107121013, filed on Jun. 19, 2018. The entirety of the above-mentioned patent application is hereby incorporated by reference herein and made a part of specification.

BACKGROUND

Field of the Disclosure

The disclosure is related to a manufacturing method of an array substrate, and particularly to a manufacturing method of an array substrate of a display panel.

Description of Related Art

In recent years, there is a tendency that display panel is designed to have a reduced area of peripheral region of array substrate, and thus a portion of fan-out lines in the peripheral region needs to be changed into the form that different conductive layers are stacked onto each other to adapt to the reduced peripheral region. However, forming more conductive layers requires more photomasks and thus the manufacturing cost is increased.

SUMMARY OF THE DISCLOSURE

At least an embodiment of the disclosure provides a manufacturing method of an array substrate, which uses less photomasks and thus reducing the manufacturing cost of array substrate.

A manufacturing method of an array substrate according to at least an embodiment of the disclosure includes the following steps. A plurality of scan lines are formed on a substrate. The substrate has a pixel region and a fan-out region. A plurality of data lines are formed. A plurality of transistors are formed. Each of the plurality of transistors is electrically connected to the corresponding scan line and the corresponding data line. A plurality of common electrodes are formed. A plurality of pixel electrodes are formed. Each of the plurality of pixel electrodes is electrically connected to the corresponding transistor. A plurality of first fan-out lines, a plurality of second fan-out lines and a plurality of third fan-out lines are formed in sequence in a fan-out region. The plurality of third fan-out lines include a transparent conductive layer and an auxiliary conductive layer. The auxiliary conductive layer is disposed on the transparent conductive layer and in contact with the transparent conductive layer. The third fan-out lines and the plurality of common electrodes are formed by the same photomask.

A manufacturing method of an array substrate according to at least an embodiment of the disclosure includes the following steps. A first metal layer is formed on a substrate. The substrate includes a pixel region and a fan-out region, and the first metal layer includes a plurality of gates and a plurality of scan lines disposed in the pixel region and a plurality of first fan-out lines disposed in the fan-out region. A gate insulating layer is formed on the first metal layer. A second metal layer is formed on the gate insulating layer. The second metal layer includes a plurality of sources, a plurality of drains and a plurality of data lines disposed in the pixel region and a plurality of second fan-out lines disposed in the fan-out region. A first insulating layer is formed on the second metal layer. A first conductive layer and the third metal layer are formed on the first insulating layer through the photomask. The first conductive layer includes a plurality of transparent conductive layers disposed in the fan-out region and a plurality of common electrodes disposed in the pixel region. The third metal layer includes a plurality of auxiliary conductive layers disposed in the fan-out region, and the plurality of auxiliary conductive layers are respectively disposed on the plurality of transparent conducive layers to constitute a plurality of third fan-out lines in the fan-out region.

Based on the above, the manufacturing method of the array substrate according to at least an embodiment of the disclosure forms the first conductive layer and the third metal layer in the fan-out region by using the same photomask, thereby reducing the number of the use of photomasks and decreasing the manufacturing cost.

In order to make the aforementioned features and advantages of the disclosure more comprehensible, embodiments accompanying figures are described in detail below.

BRIEF DESCRIPTION OF THE DRAWINGS

FIG. 1A to FIG. 10 are schematic cross-sectional views of a manufacturing method of an array substrate according to an embodiment of the disclosure.

FIG. 5 is a schematic top view of an array substrate according to an embodiment of the disclosure.

DESCRIPTION OF EMBODIMENTS

Figure 1B:
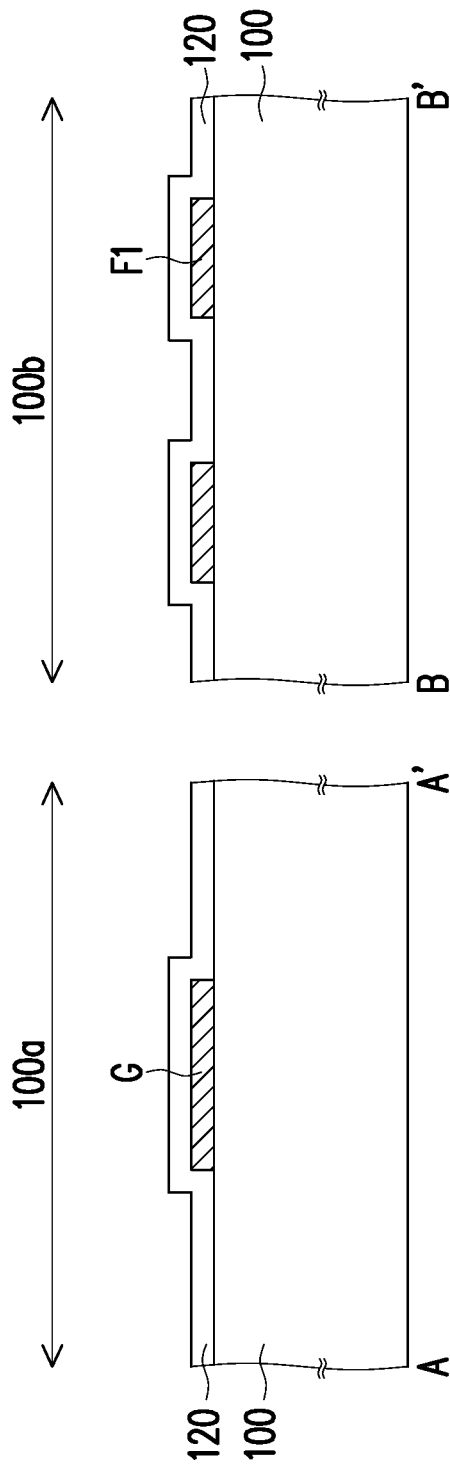

The invention is more comprehensively described with reference to the figures of the present embodiments. However, the invention may also be implemented in various different forms, and is not limited to the embodiments in the present specification. The thicknesses of the layers and regions in the figures are enlarged for clarity. The same or similar reference numerals represent the same or similar devices and are not repeated in the following paragraphs. Additionally, directional terminology, such as "top," "bottom," "left," "right," "front," or "back," etc., is used with reference to the orientation of the Figure(s) being described. As such, the directional terminology is used for purposes of illustration and is in no way limiting.

Figure 3A:
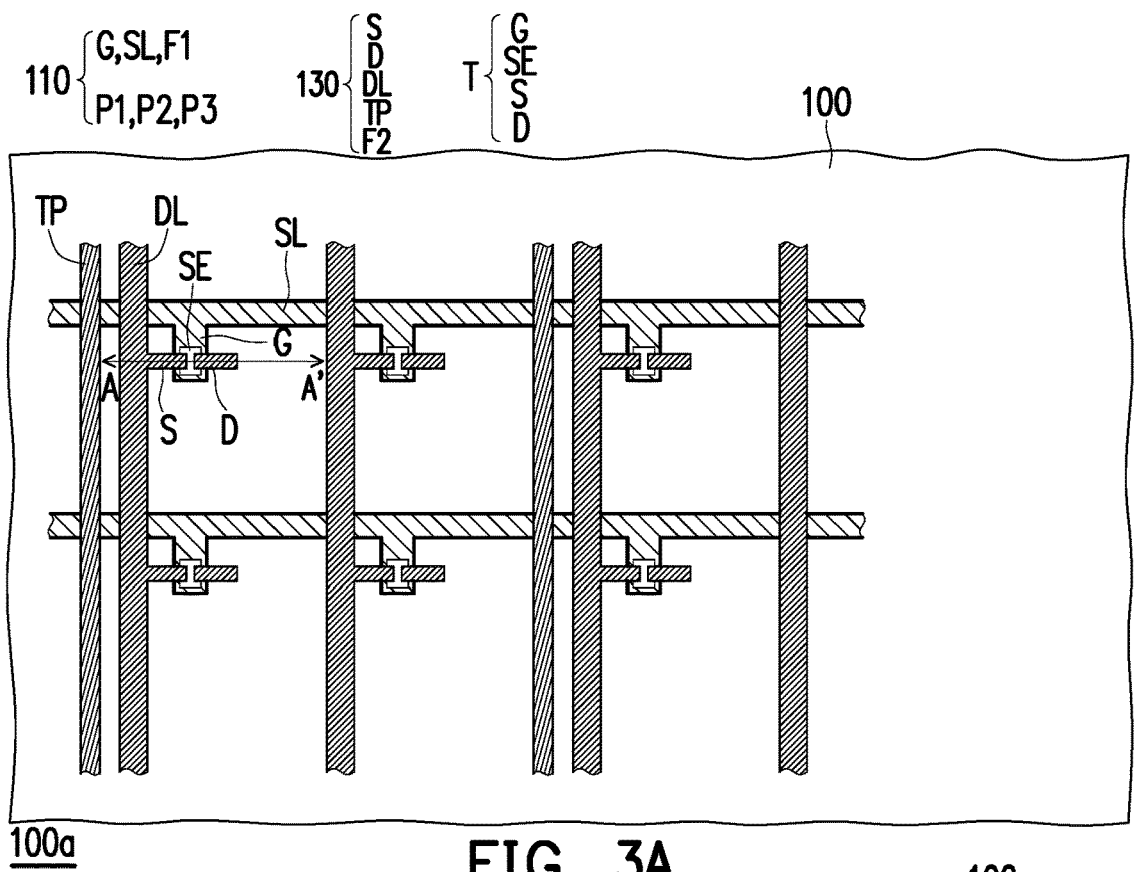
Figure 3B:
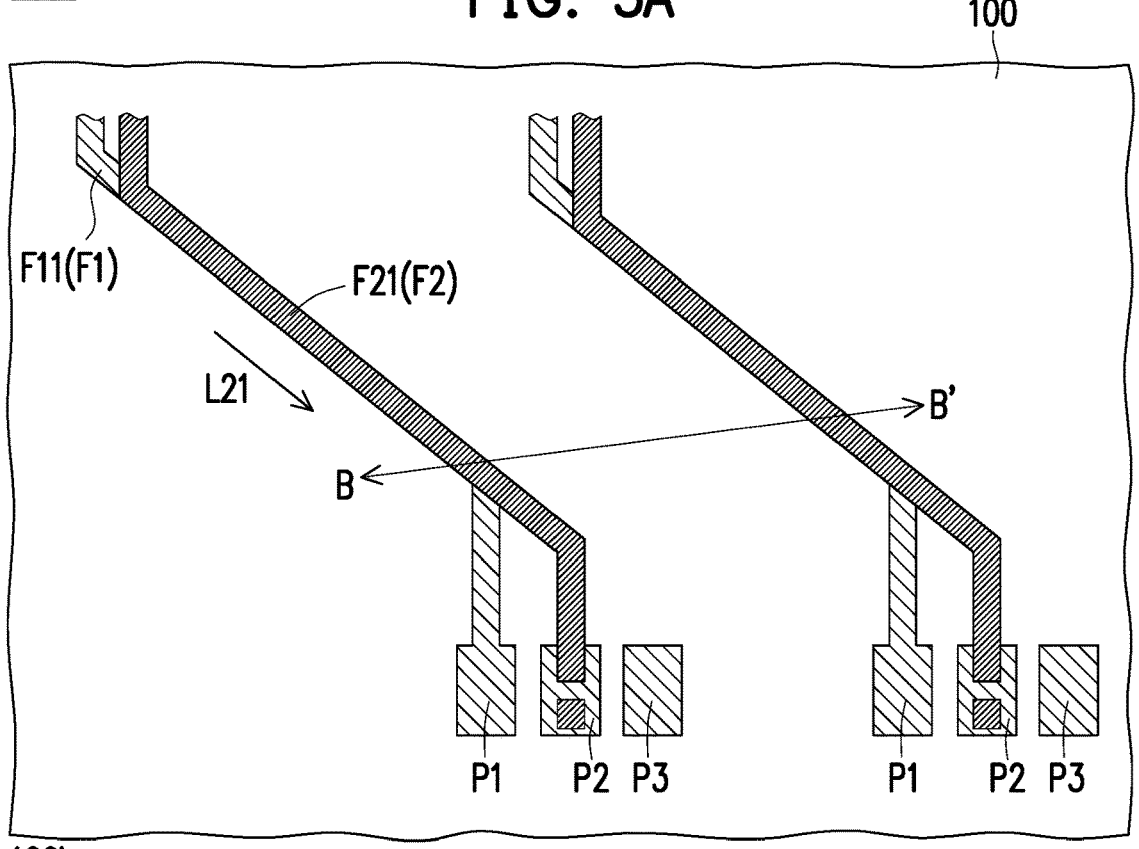
Figure 4A:
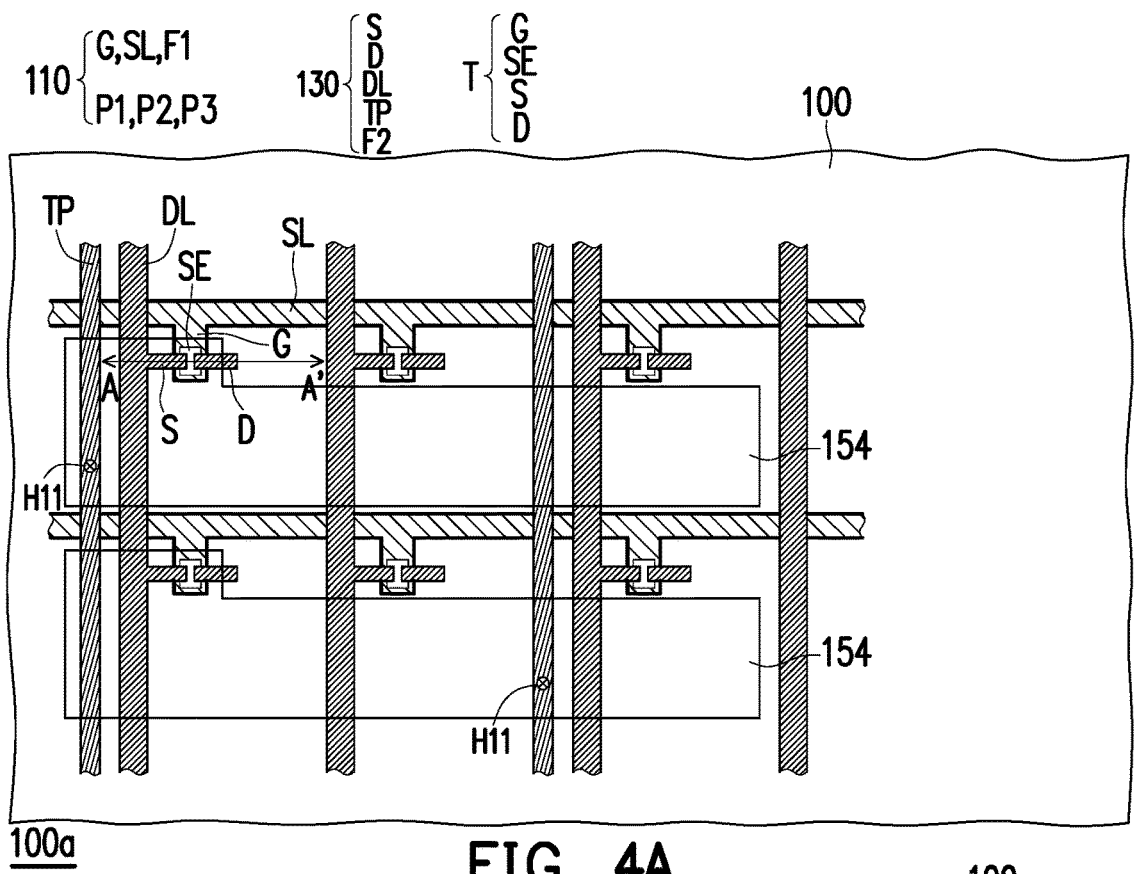
Figure 4B:
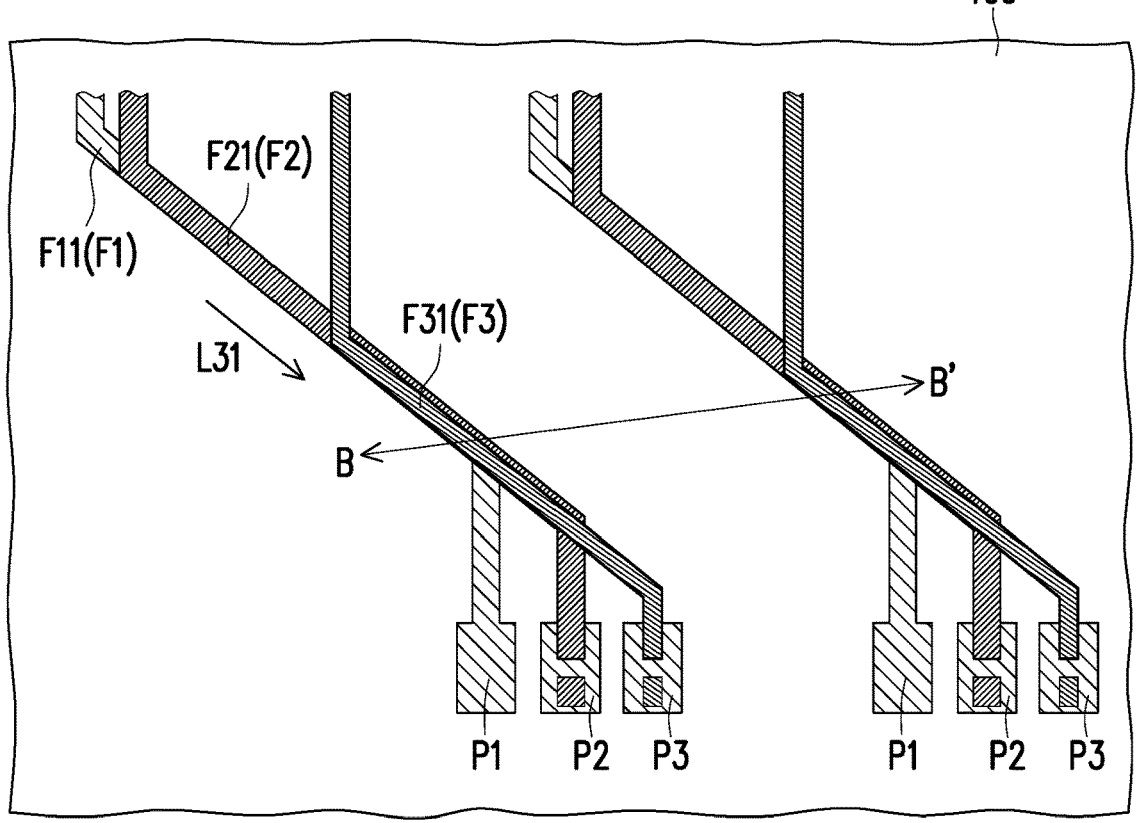
Figure 5:
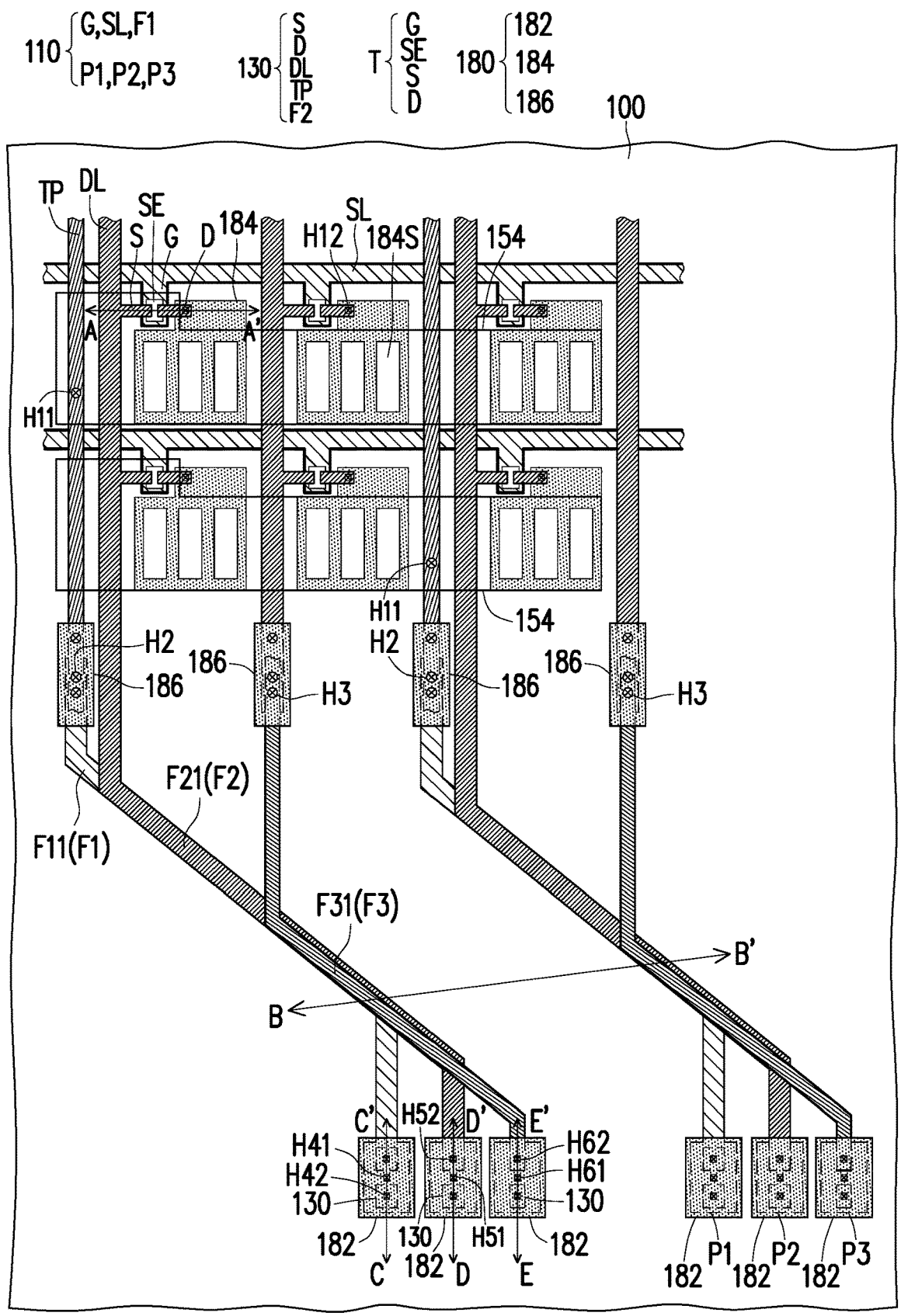

FIG. 1A to FIG. 10 are schematic cross-sectional views of a manufacturing method of an array substrate according to an embodiment of the disclosure. FIG. 2A, FIG. 3A and FIG. 4A are schematic top views of a pixel region of a manufacturing method of an array substrate according to an embodiment of the disclosure. FIG. 2B, FIG. 3B and FIG. 4B are schematic top views of a fan-out region of a manufacturing method of an array substrate according to an embodiment of the disclosure. FIG. 5 is a schematic top view of an array substrate according to an embodiment of the disclosure. FIG. 1A is a schematic cross-sectional view taken along a sectional line A-A' depicted in FIG. 2A and a sectional line B-B' depicted in FIG. 2B. FIG. 1D is a schematic cross-sectional view taken along a sectional line A-A' depicted in FIG. 3A and a sectional line B-B' depicted in FIG. 3B. FIG. 1L is a schematic cross-sectional view taken along a sectional line A-A' depicted in FIG. 4A and a sectional line B-B' depicted in FIG. 4B. FIG. 1O is a schematic cross-sectional view taken along a sectional line A-A' and a sectional line B-B' depicted in FIG. 5. FIG. 6A is a schematic cross-sectional view taken along a sectional line C-C' depicted in FIG. 5. FIG. 6B is a schematic cross-sectional view taken along a sectional line D-D' depicted in FIG. 5. FIG. 6C is a schematic cross-sectional view taken along a sectional line E-E' depicted in FIG. 5.

Figure 2A:
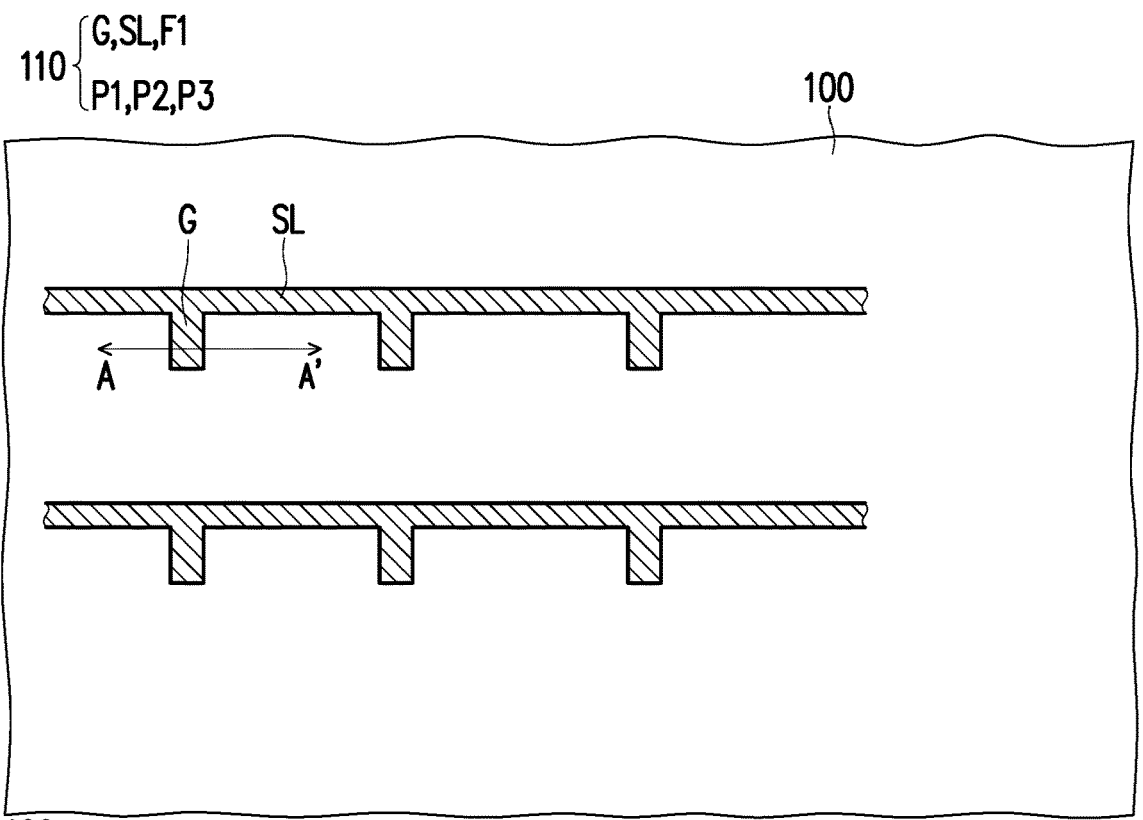
FIG. 2A, FIG. 3A and FIG. 4A are schematic top views of a pixel region of a manufacturing method of an array substrate according to an embodiment of the disclosure.
Figure 2B:
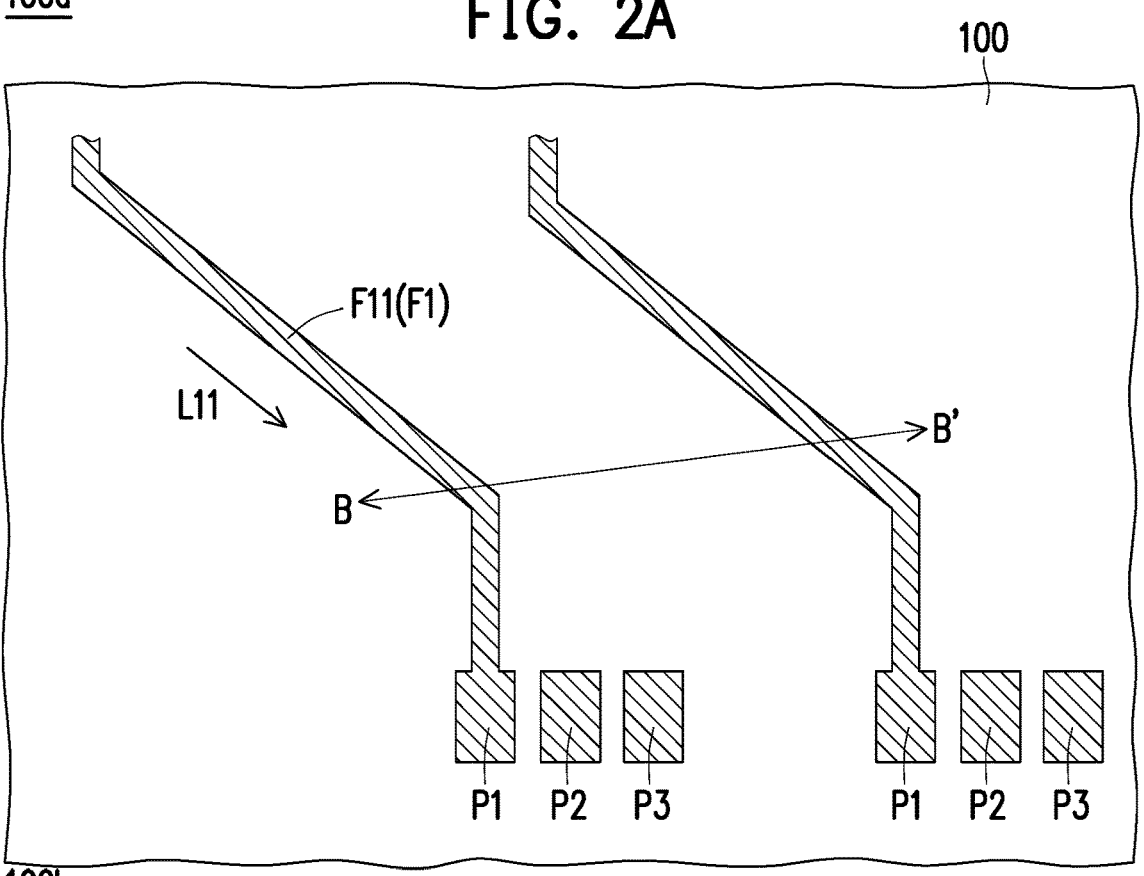
FIG. 2B, FIG. 3B and FIG. 4B are schematic top views of a fan-out region of a manufacturing method of an array substrate according to an embodiment of the disclosure.

Referring to FIG. 1A, FIG. 2A and FIG. 2B, a first metal layer 110 is formed on a substrate 100. The substrate 100 may be a flexible substrate such as a polymer substrate or a plastic substrate, but not limited thereto. In other embodiments, the substrate 100 may be a rigid substrate such as a glass substrate, a quartz substrate or a silicon substrate. The substrate 100 has a pixel region 100a and a fan-out region 100b outside the pixel region 100a. In some embodiments, selectively, the pixel region 100a may be a rectangular pixel region and the fan-out region 100b may be a neck-shaped fan-out region connected under the rectangular pixel region, but the disclosure is not limited thereto. In other embodiments, the shape of the substrate 100 may be designed differently depending on actual needs.

A forming method of the first metal layer 110 is performed, for example, by using a physical vapor deposition (PVD) method or a metal chemical vapor deposition (MCVD) method followed by a photolithography and etching process. For example, the PVD method or the MCVD method may be used first to form a first metal material layer (not shown) on the overall substrate 100. Next, a photoresist material layer (not shown) is formed on the first metal material layer. Referring to FIG. 1A, a photomask 300 is used to perform a photolithography process to the photoresist material layer (not shown) to form a patterned photoresist layer (not shown). Thereafter, the patterned photoresist layer is used as a mask to perform an etching process to the first metal material layer, thereby forming the first metal layer 110. In the embodiment, the first metal layer 110 is formed by using the photomask 300 through the first photolithography etching process.

The first metal layer 110 may include a plurality of scan lines SL, a plurality of gates G, a plurality of first fan-out lines F1, a plurality of first pads P1, a plurality of second pads P2 and a plurality of third pads P3. For ease of description, only two scan lines SL, two first pads P1, two second pads P2 and two third pads P3 are shown, but the disclosure is not limited thereto. In the embodiment, the plurality of scan lines SL, the plurality of gates G, the plurality of first fan-out lines F1, the plurality of first pads P1, the plurality of second pads P2 and the plurality of third pads P3 may be formed simultaneously. The plurality of scan lines SL and the plurality of gates G are disposed in the pixel region 100a; the plurality of first fan-out lines F1, the plurality of first pads P1, the plurality of second pads P2 and the plurality of third pads P3 are disposed in the fan-out region 100b. Each of the gates G is electrically connected to the corresponding scan line SL. Each of the first pads P is connected to the corresponding first fan-out line F1, and the plurality of second pads P2 and the plurality of third pads P3 are respectively electrically connected to the fan-out lines that are formed subsequently. Each of the first fan-out lines F1 has a first extending portion F11 extended along an extending direction L11, and the extending direction L11 is, for example, an extending direction that is not parallel with each of the scan lines SL.

Next, referring to FIG. 1B, a gate insulating layer 120 is formed on the first metal layer 110. The gate insulating layer 120 may cover the scan lines SL, the gates G, the first fan-out lines F1, the first pads P1, the second pads P2 and the third pads P3. The forming method of the gate insulating layer 120 may be performed, for example, by using a PVD method or a CVD method. In the embodiment, the material of the gate insulating layer 120 may be an inorganic material (e.g., silicon oxide, silicon nitride, silicon oxynitride, or a stacked layer of at least two of the above materials), an organic material (e.g., a polyimide-based resin, an epoxy-based resin, or an acrylic-based resin) or a combination thereof, but the disclosure is not limited thereto. The gate insulating layer 120 may be a single-layered structure, but not limited thereto. In other embodiments, the gate insulating layer 120 may be a multi-layered structure.

Figure 1C:
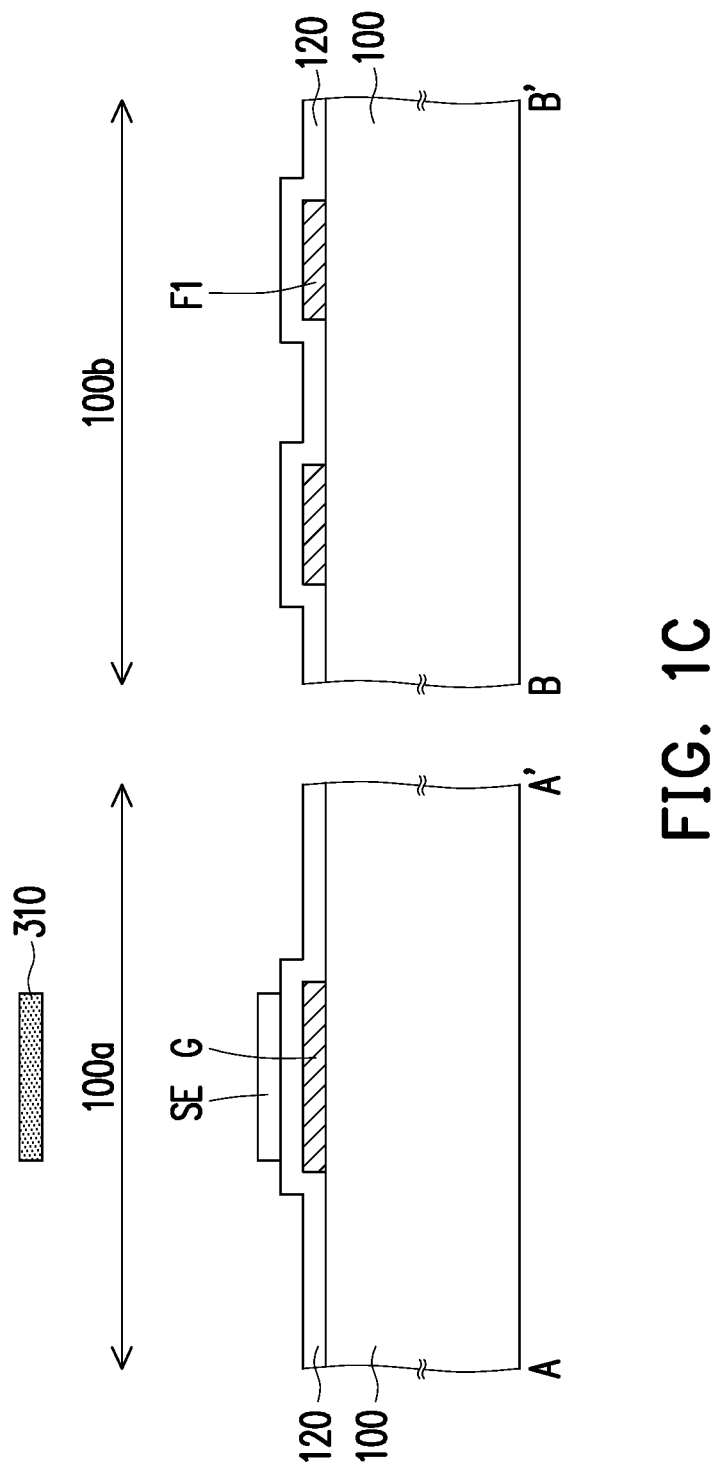

Referring to FIG. 1C, after the gate insulating layer 120 is formed, a plurality of semiconductor layers SE are formed on the gate insulating layer 120. The forming method of the plurality of semiconductor layers SE is performed, for example, by using a photolithography and etching process. For example, a PVD method of an MCVD method may be used to form a semiconductor material layer (not shown) on the overall gate insulating layer 120. Thereafter, the photoresist material layer (not shown) is formed on the semiconductor material layer. A photomask 310 is used to perform a photolithography process to the photoresist material layer (not shown) to form the patterned photoresist layer (not shown). Afterwards, the patterned photoresist layer is used as a mask to perform an etching process to the semiconductor material layer to form the plurality of semiconductor layers SE. In the embodiment, the plurality of semiconductor layers SE are formed by using the photomask 310 through the second photolithography and etching process.

In the embodiment, the material of the plurality of semiconductor layers SE may be amorphous silicon, but not limited thereto. The material of the plurality of semiconductor layers SE may be polysilicon, microcrystalline silicon, mono-crystalline silicon, nano-crystalline silicon, or other semiconductor materials with different lattice arrangement or a metal oxide semiconductor material. The plurality of semiconductor layers SE are, for example, disposed corresponding to the plurality of gates G.

Figure 1D:
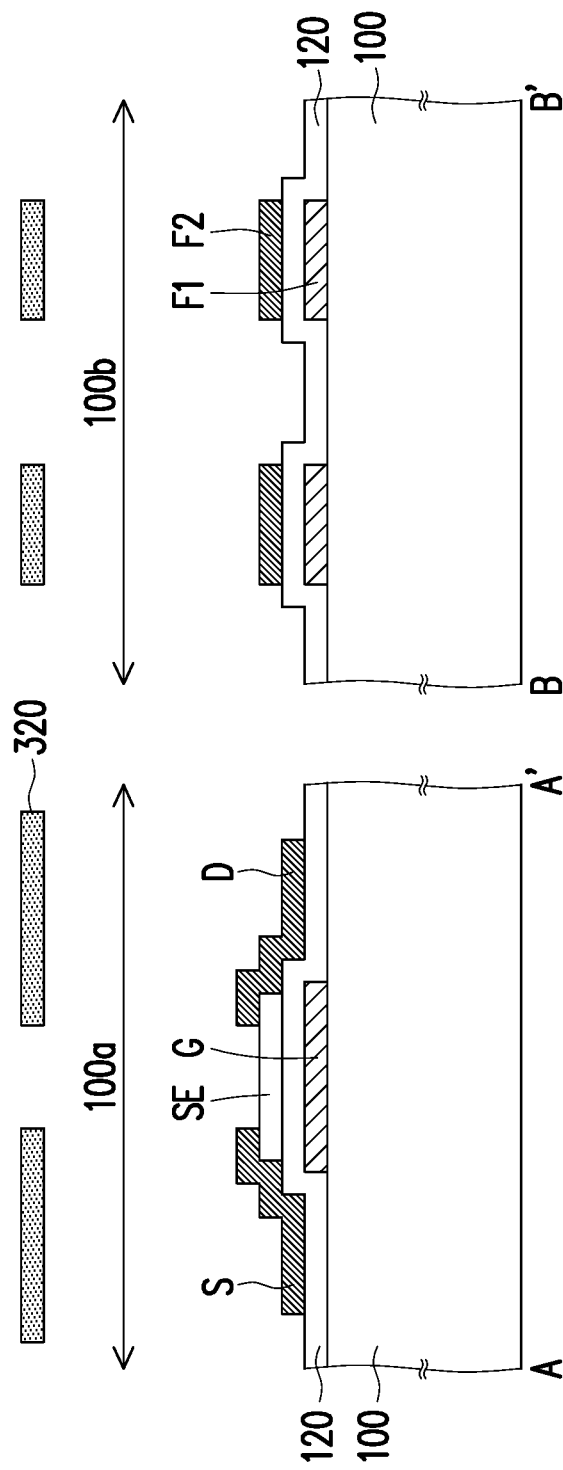

Referring to FIG. 1D, FIG. 3A and FIG. 3B, a second metal layer 130 is formed on the gate insulating layer 120. The forming method of the second metal layer 130 is performed, for example, by using a PVD method or an MCVD method followed by a photolithography and etching process. For example, the PVD method or the MCVD method may be used first to form the second metal material layer (not shown) on the overall substrate 100 to cover the gate insulating layer 120 and the semiconductor layers SE. Thereafter, the photoresist material layer (not shown) is formed on the second metal material layer. A photomask 320 is used to perform a photolithography process to the photoresist material layer (not shown), thereby forming the patterned photoresist layer (not shown). Afterwards, the patterned photoresist layer is used as a mask to perform an etching process to the second metal material layer to form the second metal layer 130. In the embodiment, the second metal layer 130 may be formed by using the photomask 320 through the third photolithography and etching process.

The second metal layer 130 includes a plurality of data lines DL, a plurality of touch signal lines TP, a plurality of sources S, a plurality of drains D and a plurality of second fan-out lines F2. In other words, the plurality of data lines DL, the plurality of touch signal lines TP, the plurality of sources S, the plurality of drains D and the plurality of second fan-out lines F2 may be formed simultaneously. The plurality of data lines DL, the plurality of touch signal lines TP, the plurality of sources S and the plurality of drains D are disposed in the pixel region 100a, and the plurality of second fan-out lines F2 are disposed in the fan-out region 100b. In the embodiment, the gate G, the semiconductor layer SE, the source S and the drain D may constitute an active element T. In the embodiment, the active element T is any kind of bottom-gate thin film transistor that is known to persons having ordinary skill in the art. However, although the embodiment is exemplified by using the bottom-gate thin film transistor, but the disclosure is not limited thereto. In other embodiments, the active element T may be a top-gate thin film transistor or other suitable thin film transistor. The source S is electrically connected to the corresponding data line DL. At least some of the data lines DL are respectively connected to the corresponding second fan-out lines F2. The touch signal line TP is electrically connected to the corresponding first fan-out line F1. Each of the second fan-out lines F2 has a second extending portion F21 extended along an extending direction L21. The extending direction L21 is, for example, an extending direction that is not parallel with each of the scan lines SL and each of the data lines DL. In the embodiment, the second extending portion F21 completely overlaps the first extending portion F11, but the disclosure is not limited thereto. In other embodiments, the second extending portion F21 may only partially overlap the first extending portion F11.

Figure 1E:
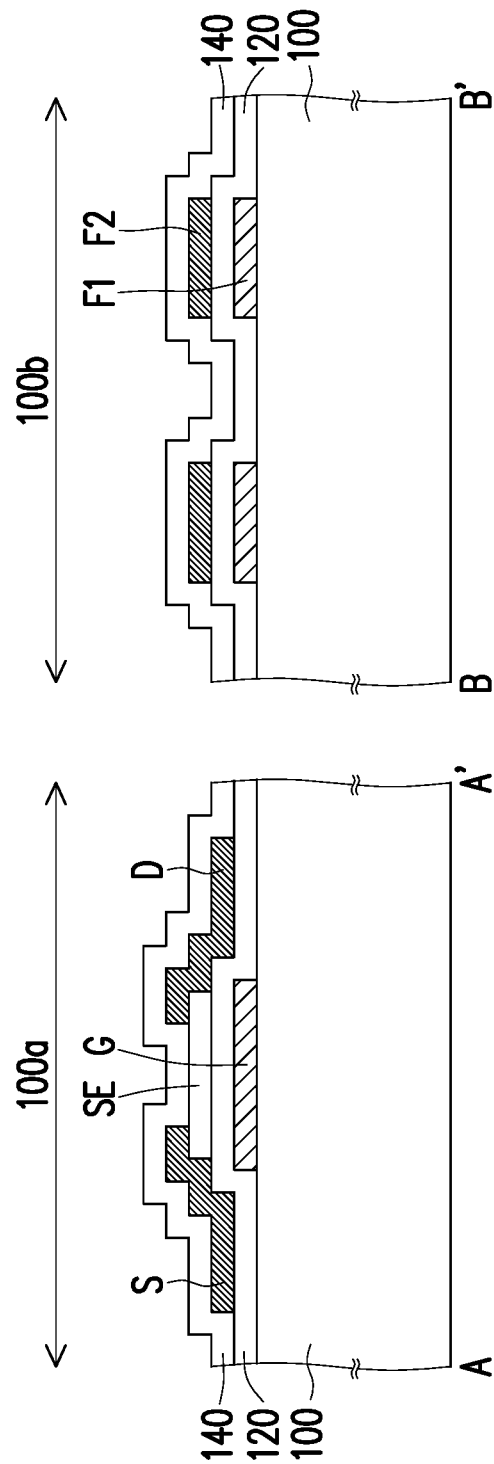

Referring to FIG. 1E, the first insulating layer 140 is formed on the second metal layer 130. The first insulating layer 140 may cover the second metal layer 130. The forming method of the first insulating layer 140 is performed, for example, by using a PVD method or a CVD method. In the embodiment, the material of the first insulating layer 140 may be an inorganic material (e.g., silicon oxide, silicon nitride, silicon oxynitride, or a stacked layer of at least two of the above materials), an organic material (e.g., a polyimide-based resin, an epoxy-based resin, or an acrylic-based resin) or a combination thereof, but the disclosure is not limited thereto. The first insulating layer 140 may be a single-layered structure, but not limited thereto. In other embodiments, the first insulating layer 140 may be a multi-layered structure.

Figure 1F:
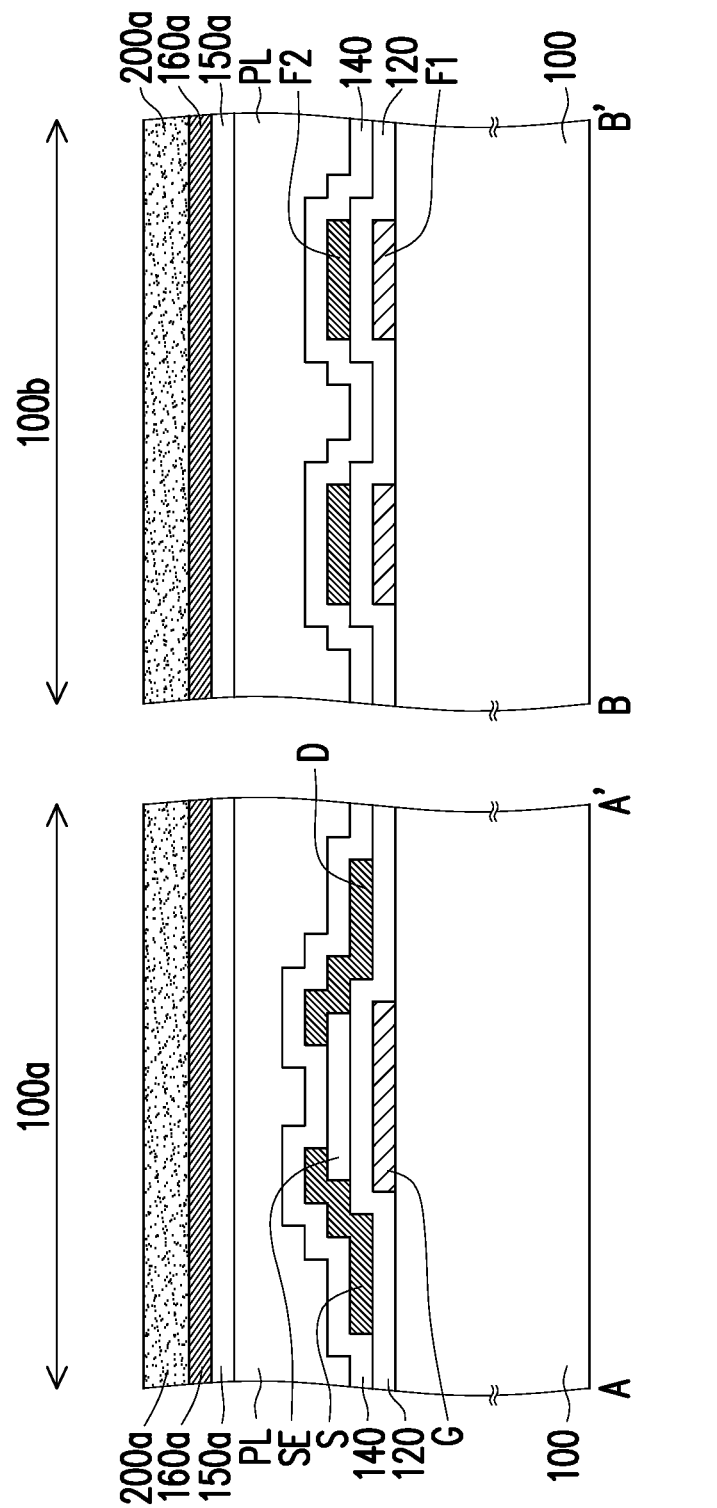

Referring to FIG. 1F, a first conductive material layer 150a, a third metal material layer 160a and a photoresist material layer 200a are formed on the first insulating layer 140 in sequence. Additionally, a planar layer PL may be selectively formed between the first conductive material layer 150a and the first insulating layer 140. In other words, the planar layer PL may not be provided between the first conductive material layer 150a and the first insulating layer 140. The forming method of the planar layer PL is performed, for example, by using a PVD method or a CVD method. In the embodiment, the material of the planar layer PL may be an inorganic material (e.g., silicon oxide, silicon nitride, silicon oxynitride, or a stacked layer of at least two of the above materials), an organic material (e.g., a polyimide-based resin, an epoxy-based resin, or an acrylic-based resin) or a combination thereof, but the disclosure is not limited thereto. The planar layer PL may be a single-layered structure, but not limited thereto. In other embodiments, the planar layer PL may be a multi-layered structure. The forming method of the first conductive material layer 150a is performed, for example, by using a sputtering process, but not limited thereto. The material of the first conductive material layer 150a may be a metal oxide conductive material (e.g., indium-tin-oxide, indium-zinc-oxide, aluminum-tin-oxide, aluminum-zinc-oxide, indium-gallium-zinc-oxide), other suitable transparent conductive material or a stacked layer of at least two of the above materials. In the embodiment, the first conductive material layer 150a is exemplified as a transparent conductive material layer. The forming method of the third metal material layer 160a is performed, for example, by using a PVD method or an MCVD method, but the disclosure is not limited thereto. In the embodiment, the third metal material layer 160a is exemplified as an auxiliary conductive material layer. In the embodiment, the photoresist material layer 200a is positive photoresist, but not limited thereto. In other embodiments, the photoresist material layer 200a may be negative photoresist.

Figure 1G:
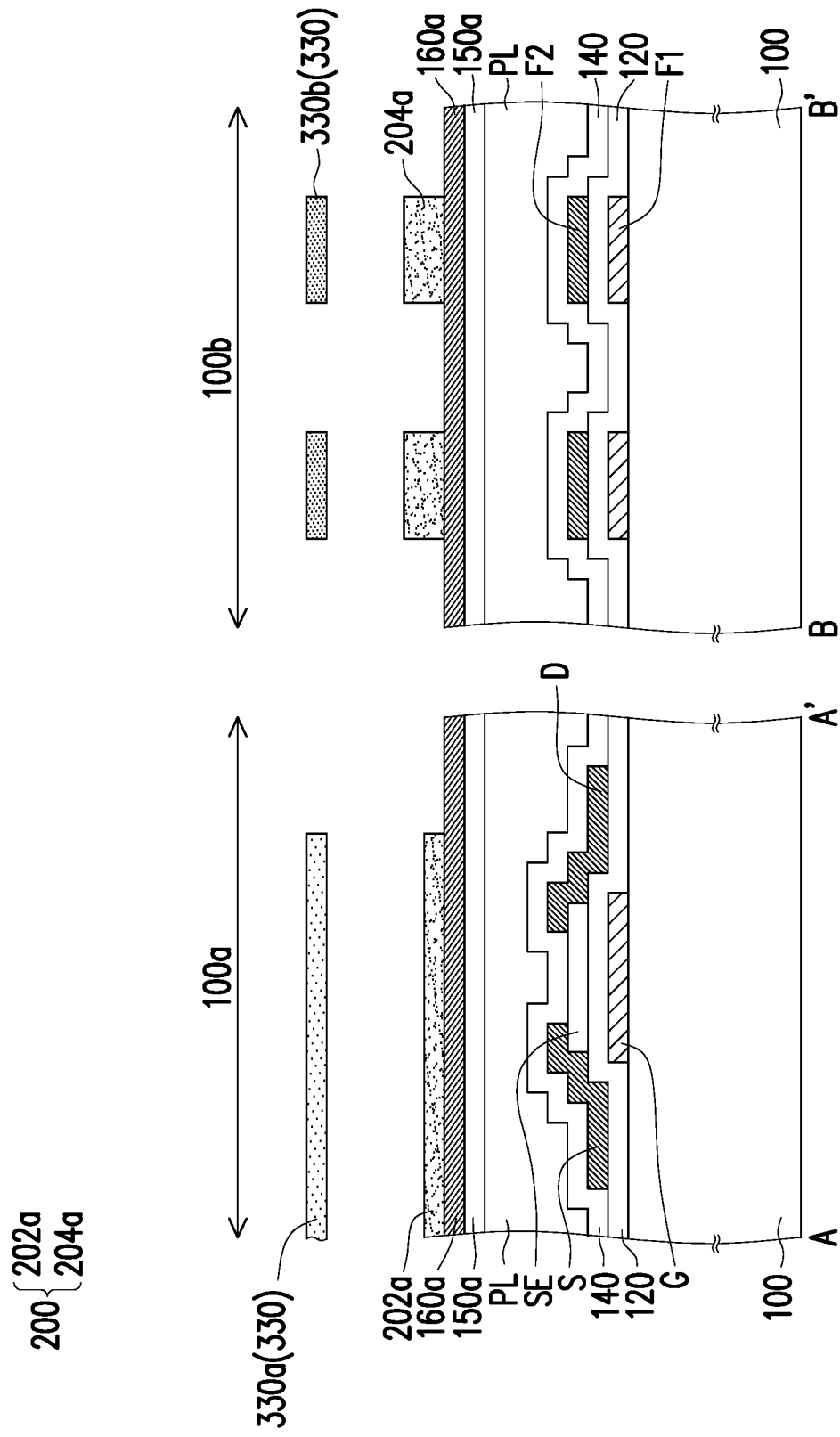

Referring to FIG 1F and FIG. 1G, a photomask 330 is used to pattern the photoresist material layer 200a to form the photoresist layer 200. In the embodiment, the photomask 330 is a half-tone mask. The photomask 330 has a plurality of first regions 330a corresponding to the pixel region 100a and a plurality of second regions 330b corresponding to the fan-out region 100b. The light transmittance of the first region 330a is, for example, higher than the light transmittance of the second region 330b. The photoresist layer 200 includes a plurality of first blocks 202a corresponding to the pixel region 100a and a plurality of second blocks 204a corresponding to the fan-out region 100b. The thickness of each of the second block 204a is greater than the thickness of each of the first block 202a, the thickness of each of the first blocks 202a is, for example, 10%-50% of the thickness of each of the second blocks 204a.

Figure 1H:
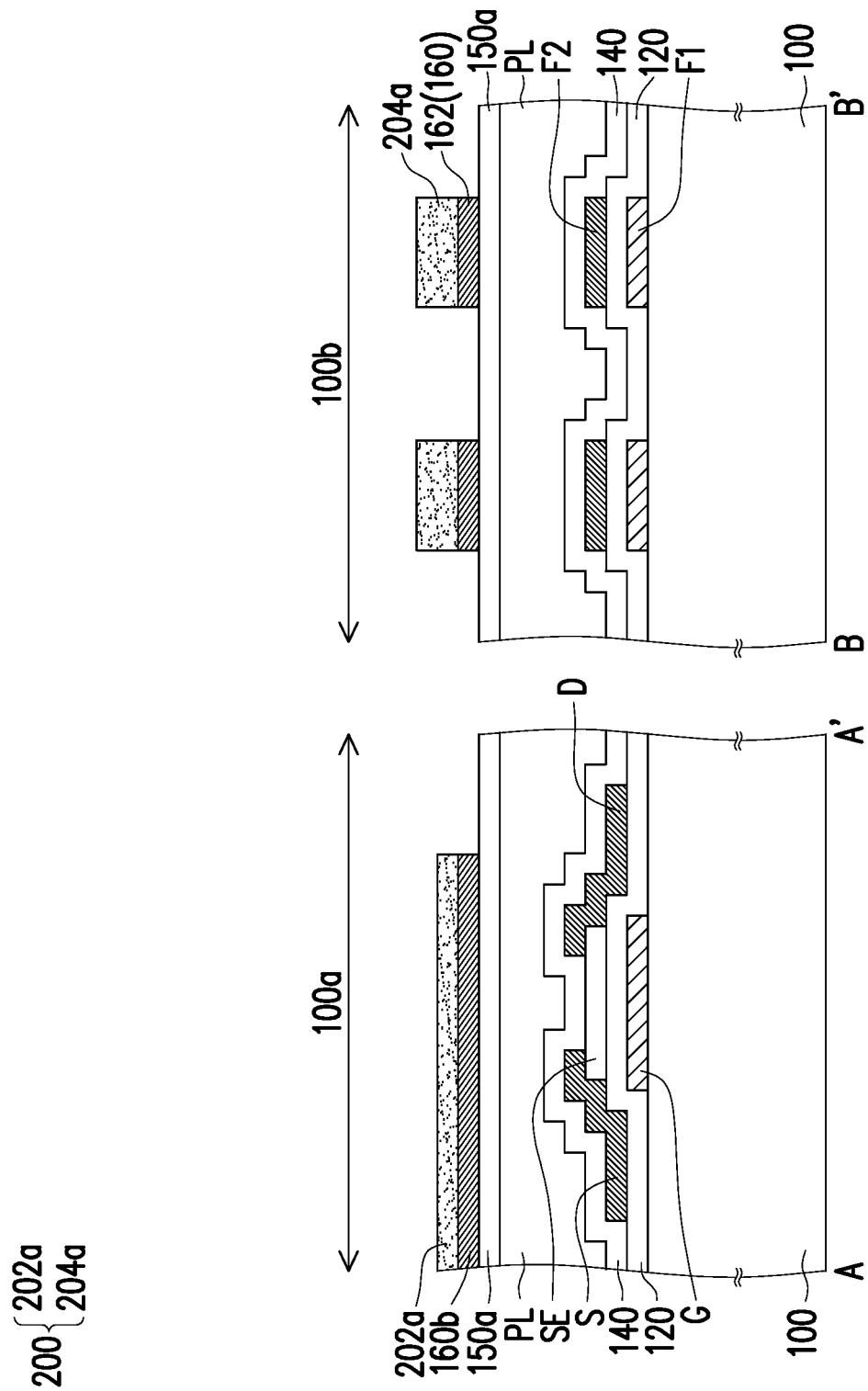

Referring to FIG. 1G and FIG. 1H, the photoresist layer 200 is used to pattern a third metal material layer 160a to form a plurality of auxiliary conductive layers 162 in the fan-out region 100b and form the remaining third metal material layer 160b in the pixel region 100a. The method of patterning the third metal material layer 160a is performed, for example, by using a wet etching process, and the etching liquid that is adopted is aluminate, but the disclosure is not limited thereto.

Figure 1I:
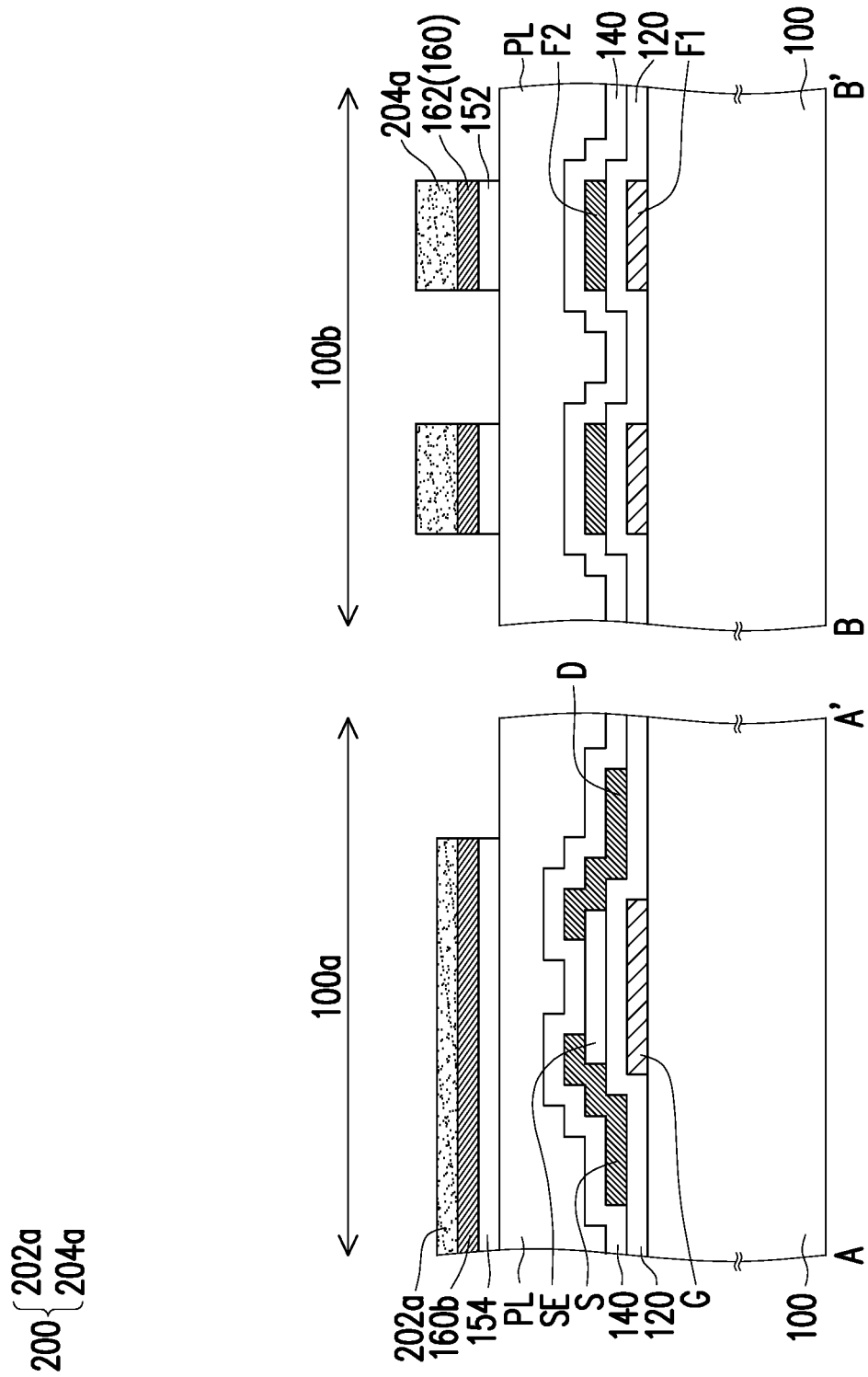

Referring to FIG. 1H and FIG. 1I, the photoresist layer 200 is used to pattern the first conductive material layer 150a to form a plurality of transparent conductive layers 152 in the fan-out region 100b and a plurality of common electrodes 154 in the pixel region 100a. The method of patterning the first conductive material layer 150a is performed, for example, by using a wet etching process, and the etching liquid that is adopted is, for example, oxalate, but the disclosure is not limited thereto. Each of the transparent conductive layers 152 and the corresponding auxiliary conductive layer 162 may form a stacked structure respectively and overlap with each other.

Figure 1J:
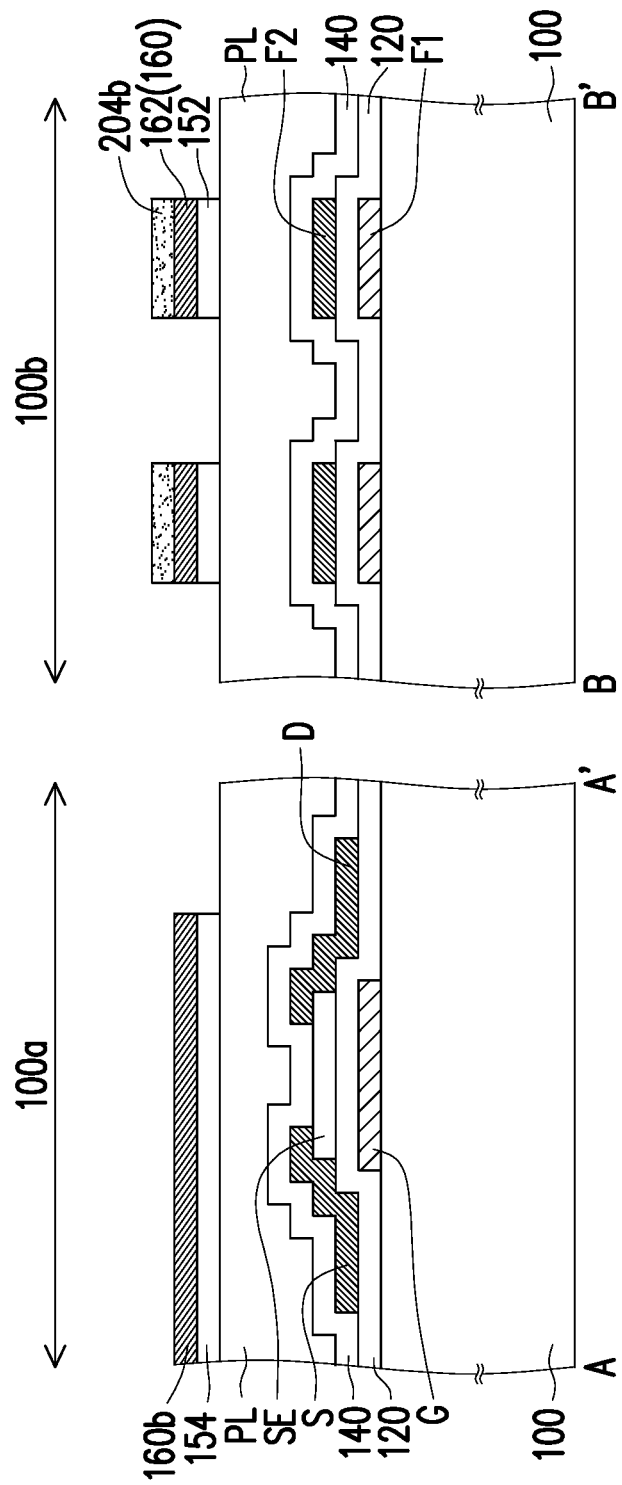

Referring to FIG. 1I and FIG. 1J, the first blocks 202a are removed to substantially expose the remaining third metal material layer 160b. The method of removing the first blocks 202a is performed, for example, by using an ashing process, but the disclosure is not limited thereto. When the first blocks 202a are removed through the ashing process, a portion of each of the second blocks 204a is also removed at the same time, thereby forming the remaining second blocks 204b on the auxiliary conductive layers 162. The thickness of the remaining second block 204b is, for example, 20%-50% of the thickness of the second block 204a.

Figure 1K:
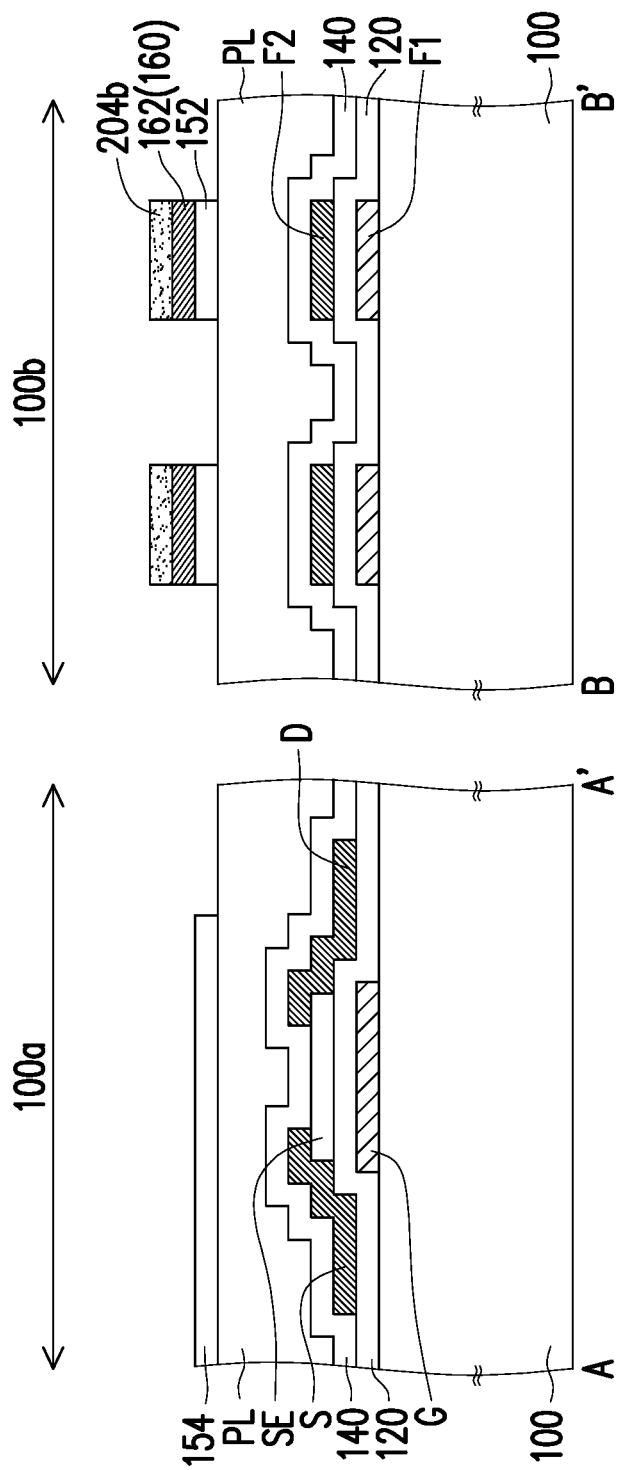

Referring to FIG. 1J and FIG. 1K, the remaining third metal material layer 160b in the pixel region 100a is removed. The method of removing the remaining third metal material layer 160b from the pixel region 100a is performed, for example, by using a wet etching process, and the etching liquid that is adopted is, for example, aluminate, but the disclosure is not limited thereto. After the remaining third metal material layer 160b is removed, the top surfaces of the common electrodes 154 are exposed in the pixel region 100a.

Figure 1L:
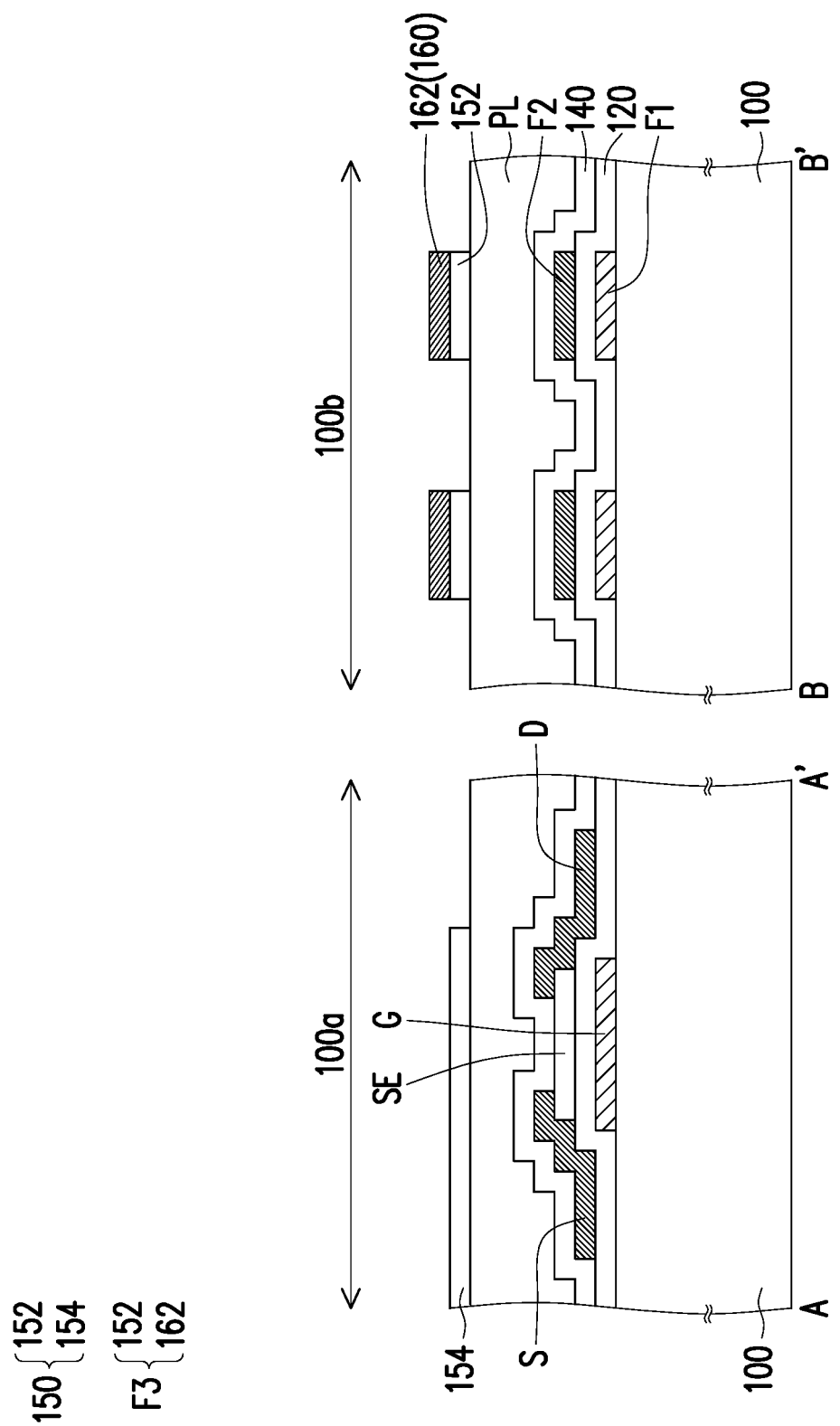

Referring to FIG. 1L, FIG. 4A and FIG. 4B, the remaining second blocks 204b are removed. The method of removing the remaining second blocks 204b is performed, for example, by using an ashing process, but the disclosure is not limited thereto. After removing the remaining second blocks 204b, the first conductive layer 150 and the third metal layer 160 are formed on the first insulating layer 140. The first conductive layer 150 is, for example, a transparent conductive layer constructed by the transparent conductive layers 152 and the common electrodes 154. The third metal layer 160, for example, includes the plurality of auxiliary conductive layers 162 and is disposed on the first conductive layer 150. Viewing from another direction, the plurality of common electrodes 154 are disposed in the pixel region 100a, and the plurality of transparent conductive layers 152 and the plurality of auxiliary conductive layers 162 are disposed in the fan-out region 100b.

The stacked structures that are formed by the transparent conductive layers 152 and the auxiliary conductive layers 162 may respectively construct a plurality of third fan-out lines F3. Referring to FIG. 4B, each of the third fan-out lines F3 has a third extending portion F31 extended along an extending direction L31. The extending direction L31 is, for example, an extending direction that is not parallel with each of the scan lines SL and each of the data lines DL. In the embodiment, the third extending portion F31 may completely overlap the first extending portion F11 and the second extending portion F21, but the disclosure is not limited thereto. In other embodiments, at least two of the first extending portion F11, the second extending portion F21 and the third extending portion F31 are stacked alternately. For example, among the first extending portion F11, the second extending portion F21 and the third extending portion F31 that are adjacent to each other and arranged in sequence in the normal direction of the substrate 100, at least a portion of the second extending portion F21 does not overlap the first extending portion F11 and the third extending portion F31. Additionally, each common electrode 154 may be, for example, electrically connected with the corresponding touch signal line TP through a corresponding contact via H11.

It can be obtained that, in the embodiment, the first conductive layer 150 and the third metal layer 160 may be formed simultaneously by using the same photomask 330.

Based on the above, the half-tone photomask (photomask 330) may be used to form the first conductive layer 150 and the third metal layer 160 simultaneously, which reduces the use of one photomask as compared with conventional manufacturing process, thereby reducing the manufacturing cost of array substrate.

Figure 1M:
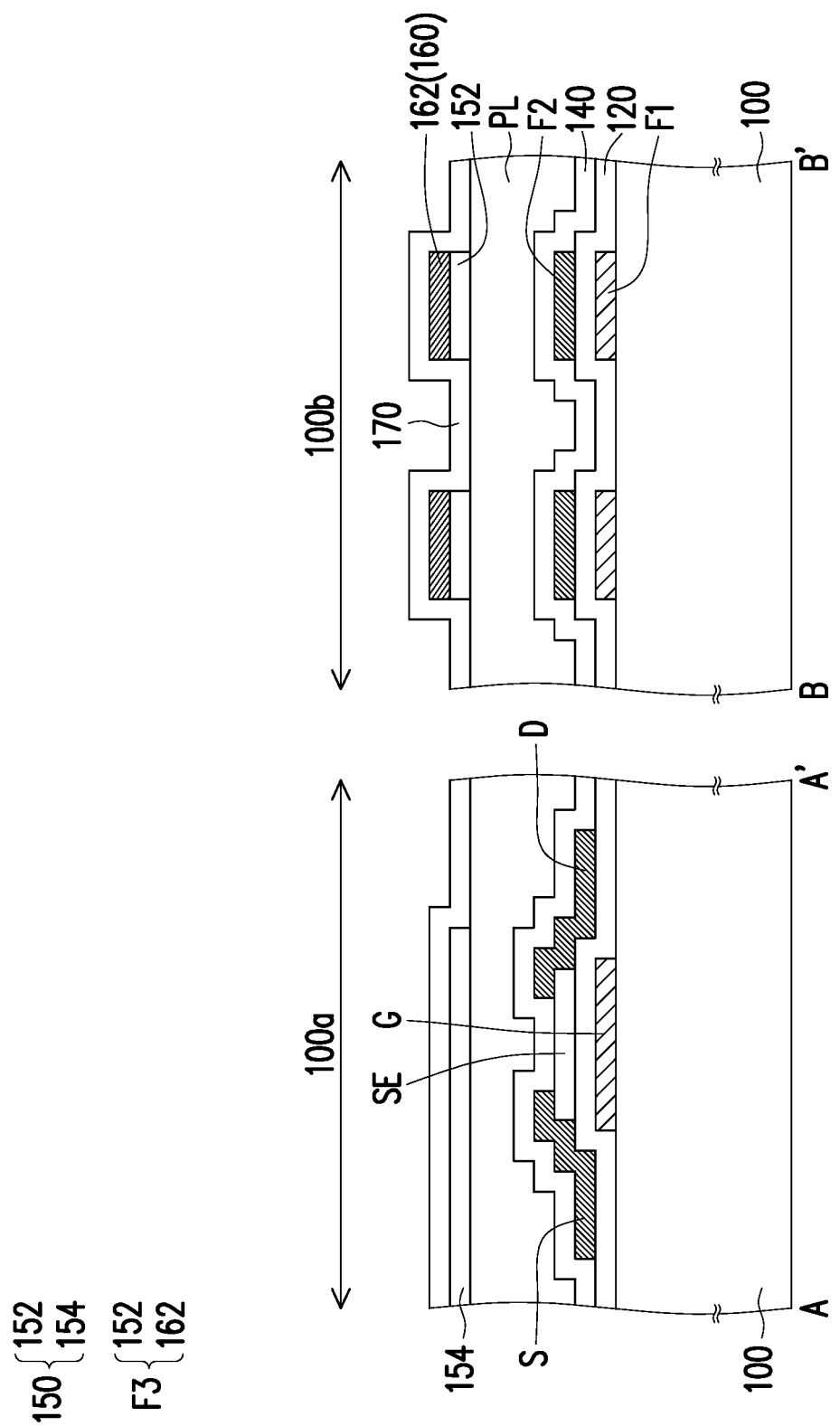

Referring to FIG. 1M, a second insulating layer 170 is formed on the first conductive layer 150 and the third metal layer 160. The second insulating layer 170 may cover both of the first conductive layer 150 and the third metal layer 160. The method of forming the second insulating layer 170 is performed, for example, by using the PVD method or the CVD method. In the embodiment, the material of the second insulating layer 170 may be an inorganic material (e.g., silicon oxide, silicon nitride, silicon oxynitride, or a stacked layer of at least two of the above materials), an organic material (e.g., a polyimide-based resin, an epoxy-based resin, or an acrylic-based resin) or a combination thereof, but the disclosure is not limited thereto. The second insulating layer 170 may be a single-layered structure, but not limited thereto. In other embodiments, the second insulating layer 170 may be a multi-layered structure.

Figure 1N:
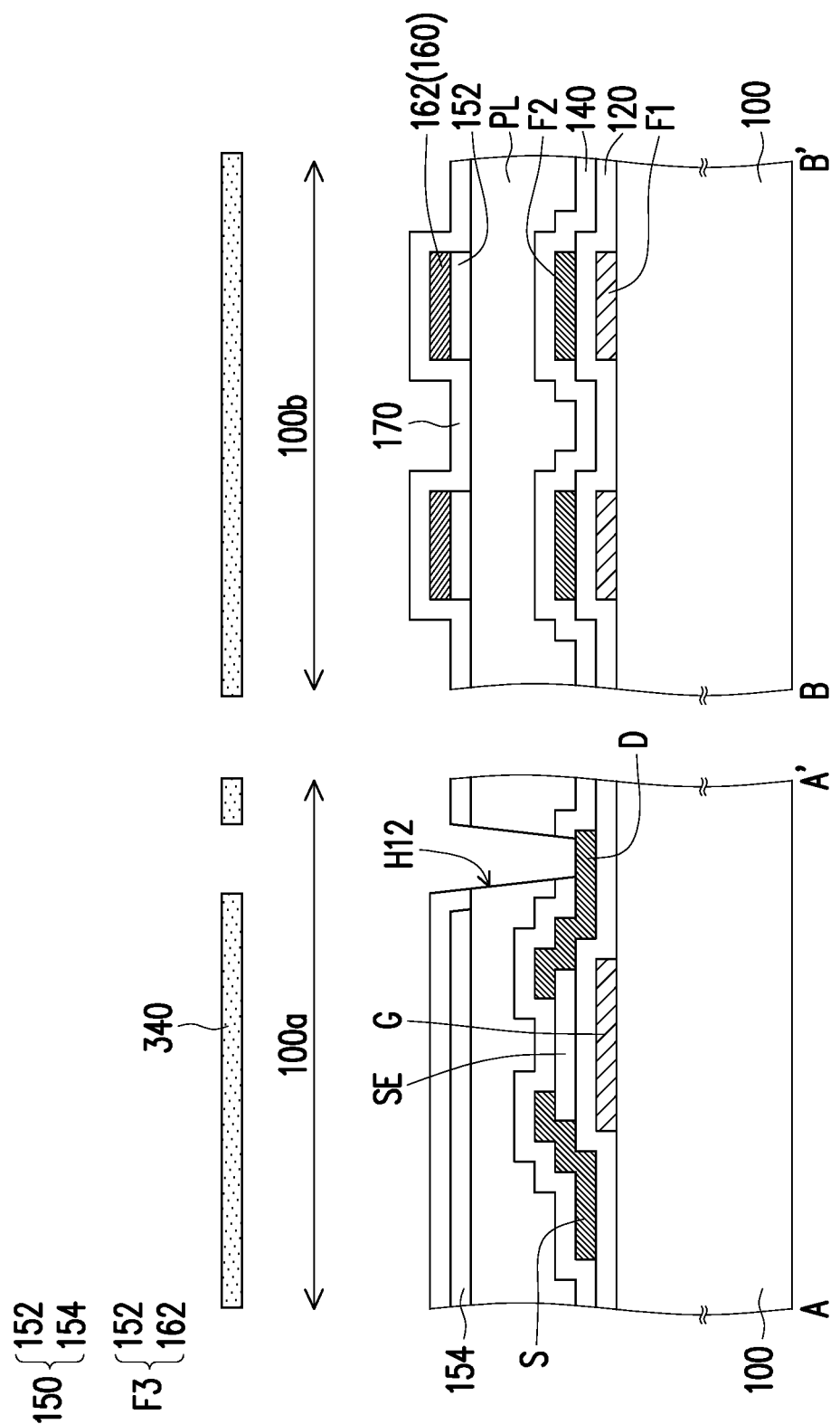
Figure 10:
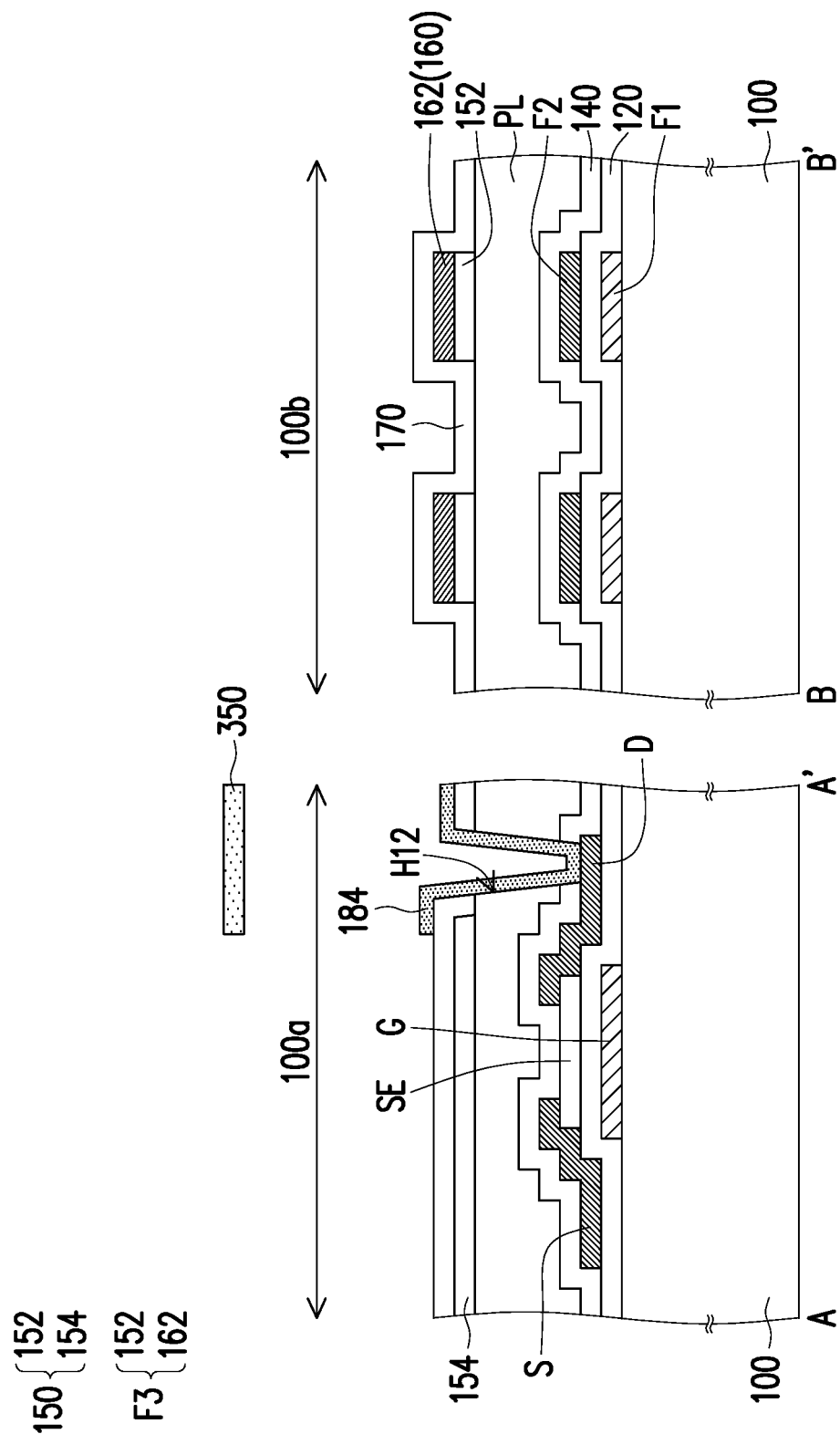

Referring to FIG. 1N, contact vias H12 are formed in the first insulating layer 140, the planar layer PL, the second insulating layer 170 to expose the drains D. The method of forming the contact vias H12 is performed, for example, by using a photomask 340 to perform a photolithography and etching process. First of all, the photoresist material layer (not shown) is formed on the second insulating layer 170. The photomask 340 is used to perform a photolithography process to the photoresist material layer (not shown) to form the patterned photoresist layer (not shown). Thereafter, the patterned photoresist layer is used as the mask to perform an etching process to the first insulating layer 140, the planar layer PL and the second insulating layer 170 to form the contact vias H12. It can be obtained that, in the embodiment, the contact vias H12 are formed by using the photomask 340 through the fifth photolithography and etching process.

Referring to FIG. 1O, FIG. 5, FIG. 6A, FIG. 6B and FIG. 6C, a second conductive layer 180 is formed on the second insulating layer 170. The method of forming the second conductive layer 180 is performed, for example, by using a PVD method or an MCVD method followed by a photolithography and etching process. For example, the PVD method or the MCVD method may be used first to form a second conductive material layer (not shown) on the overall substrate 100. Thereafter, the photoresist material layer (not shown) is formed on the second conducive material layer. A photomask 350 is used to perform a photolithography process to the photoresist material layer (not shown) to form the patterned photoresist layer (not shown). Afterwards, the patterned photoresist layer is used as a mask to perform an etching process to the second conducive material layer to form the second conductive layer 180. It can be obtained that, in the embodiment, the second conductive layer 180 is formed by using the photomask 350 through the sixth photolithography and etching process.

The second conductive layer 180, for example, includes a plurality of bridge electrodes 182, a plurality of pixel electrodes 184, and a plurality of connecting electrodes 186. The plurality of pixel electrodes 184 are disposed in the pixel region 100a, and the plurality of bridge electrodes 182 are disposed in the fan-out region 100b. The plurality of pixel electrodes 184 are eclectically connected to the drains D through the contact vias H12. In the embodiment, each of the pixel electrodes 184 has a plurality of slits 184S overlapped with the corresponding common electrode 154 along a vertical projection direction of the substrate 100. In the embodiment, the plurality of slits 184S are formed with a rectangular shape, for example, but the disclosure is not limited thereto.

Referring to FIG. 5, each of a plurality of contact vias H2 exposes the corresponding touch signal line TP and the corresponding first fan-out line F1, and electrically connects the same through the corresponding connecting electrode 186. Each of a plurality of contact vias H3 exposes a portion of the data lines DL and the corresponding third fan-out line F3, and electrically connects the same through the corresponding connecting electrode 186. Another portion of the data lines DL is, for example, directly connected to the corresponding second fan-out line F2.

Figure 6A:
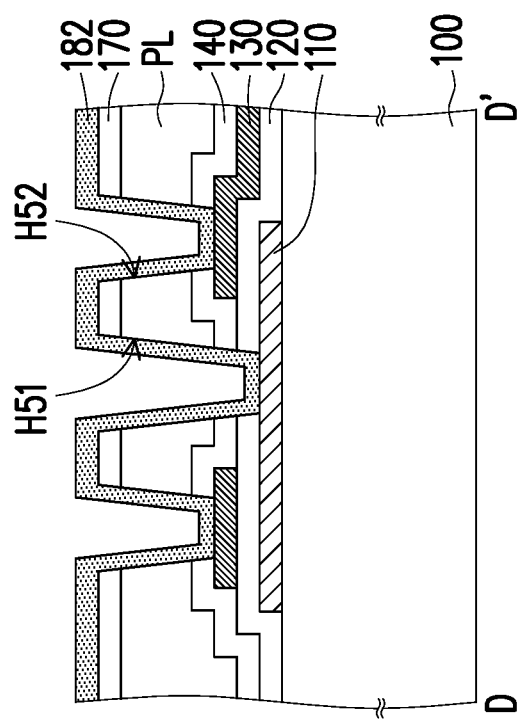
FIG. 6A is a schematic cross-sectional view taken along a sectional line C-C' depicted in FIG. 5.

Referring to FIG. 5 and FIG. 6A, after the second insulating layer 170 is formed and before the second conductive layer 180 is formed, contact vias H41 are formed in the gate insulating layer 120, the first insulating layer 140, the planer layer PL and the second insulating layer 170 to expose a portion of the first metal layer 110, that is, exposing a portion of the first pads P1, and contact vias H42 are formed in the first insulating layer 140, the planar layer PL and the second insulating layer 170 to expose a portion of the second metal layer 130. The method of forming the contact vias H41 and H42 is performed, for example, by using a photolithography and etching process, but the disclosure is not limited thereto. In other embodiments, before the second metal layer 130 is formed, the contact vias may be formed in the gate insulating layer 120 to expose a portion of the first metal layer 110, and after the second insulating layer 170 is formed and before the second conductive layer 180 is formed, the contact vias are formed in the first insulating layer 140, the planar layer PL and the second insulating layer 170 to connect to the contact vias in the gate insulating layer 120, thereby exposing a portion of the first metal layer 110, that is, exposing a portion of the first pads P1. The second metal layer 130 above the first pads P1 is electrically connected to the first pads P1 through the bridge electrodes 182, the contact vias H41 and H42.

Figure 6B:
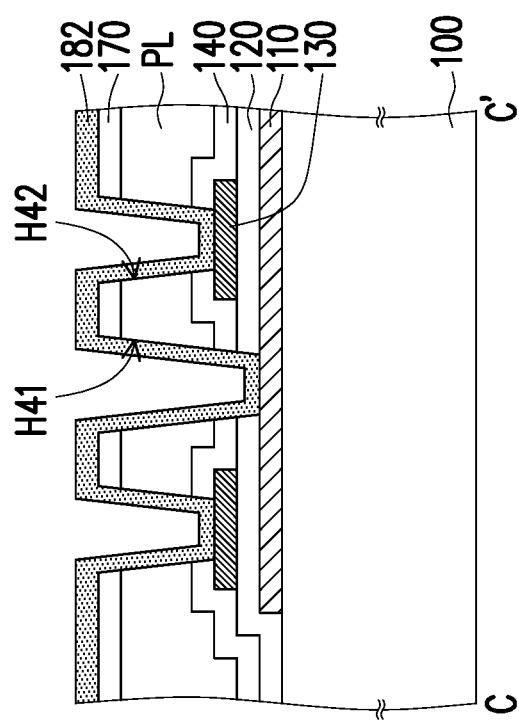
FIG. 6B is a schematic cross-sectional view taken along a sectional line D-D' depicted in FIG. 5.

Referring to FIG. 5 and FIG. 6B, after the second insulating layer 170 is formed and before the second conductive layer 180 is formed, contact vias H51 are formed in the gate insulating layer 120, the first insulating layer 140, the planar layer PL and the second insulating layer 170, thereby exposing a portion of the first metal layer 110, that is, exposing a portion of the second pads P2, and contact vias H52 are formed in the first insulating layer 140, the planar layer PL and the second insulating layer 170, thereby exposing a portion of the second metal layer 130. The method of forming the contact vias H51 and H52 is performed, for example, by using a photolithography and etching process, but the disclosure is not limited thereto. In other embodiments, before the second metal layer 130 is formed, the contact vias may be formed in the gate insulting layer 120 to expose a portion of the first metal layer 110, and after the second insulating layer 170 is formed and before the second conductive layer 180 is formed, the contact vias are formed in the first insulating layer 140, the planar layer PL and the second insulating layer 170 to connect to the contact vias in the gate insulating layer 120 to expose a portion of the first metal layer 110, that is, exposing a portion of the second pads P2. The second fan-out lines F2 are electrically connected with the second pads P2 through the bridge electrodes 182, the contacts via H51 and H52.

Figure 6C:
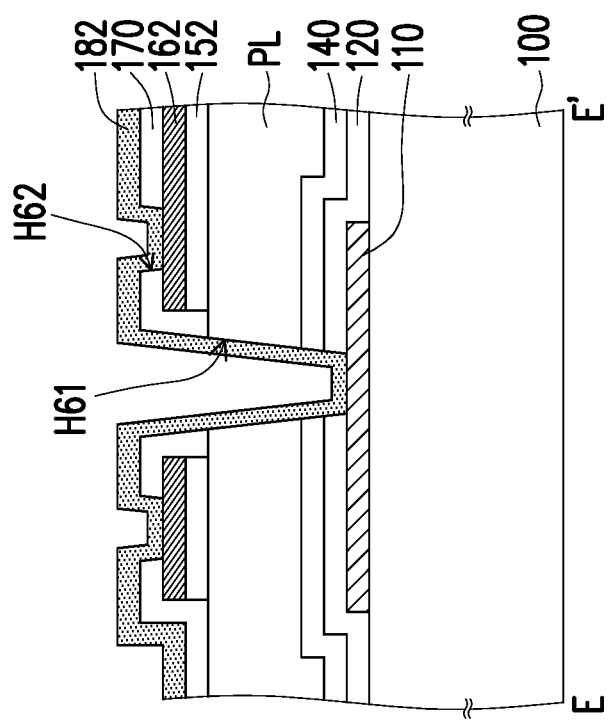
FIG. 6C is a schematic cross-sectional view taken along a sectional line E-E' depicted in FIG. 5.

Referring to FIG. 5 and FIG. 6C, after the second insulating layer 170 is formed and before the second conductive layer 180 is formed, contact vias H61 are formed in the gate insulating layer 120, the first insulating layer 140, the planar layer PL and the second insulating layer 170 to expose a portion of the first metal layer 110, that is, exposing a portion of the third pads P3, and contact vias H62 are formed in the second insulating layer 170 to expose a portion of the third fan-out lines F3, that is, exposing a portion of the auxiliary conductive layers 162. The method of forming the contact via H61 and H62 is performed, for example, by using a photolithography and etching process, but the disclosure is not limited thereto. In other embodiments, before the second metal layer 130 is formed, the contact vias may be formed in the gate insulating layer 120 to expose a portion of the first metal layer 110, and after the second insulating layer 170 is formed and before the second conductive layer 180 is formed, the contact vias are formed in the first insulating layer 140, the planar layer PL and the second insulating layer 170 to connect to the contact vias in the gate insulating layer 120 to expose a portion of the first metal layer 110, that is, exposing a portion of the third pads P3. The third fan-out lines F3 are electrically connected with the third pads P3 through the bridge electrodes 182, the contact vias H61 and H62.

In summary, the manufacturing method of the array substrate according to at least one embodiment of the disclosure uses the same photomask to form the first conductive layer and the third metal layer in the fan-out region, and therefore the third fan-out lines that are formed by the first conductive layer and the third metal layer along with the first fan-out lines and the second fan-out lines may form a three-layered stacked metal layer (i.e., a stacked structure that is formed by the first extending portions, the second extending portions and third extending portions). In this way, the area of the fan-out region is reduced so that the area of the pixel region is indirectly increased, while the use of photomask is reduced, thereby decreasing the manufacturing cost of the array substrate.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A manufacturing method of an array substrate, comprising:
    forming a plurality of scan lines on a substrate, the substrate having a pixel region and a fan-out region;
    forming a plurality of data lines;
    forming a plurality of transistors, wherein each of the transistors is electrically connected to the corresponding scan line and the corresponding data line;
    forming a plurality of common electrodes;
    forming a plurality of pixel electrodes, wherein each of the pixel electrodes is electrically connected to the corresponding transistor;
    forming a plurality of first fan-out lines in the fan-out region;
    forming a plurality of second fan-out lines in the fan-out region; and
    forming a plurality of third fan-out lines in the fan-out region, wherein each of the third fan-out lines comprises:
        a transparent conductive layer; and
        an auxiliary conductive layer, disposed on the transparent conductive layer and in contact with the transparent conductive layer;
    wherein the third fan-out lines and the common electrodes are formed by a same photomask.
2. The manufacturing method of the array substrate according to claim 1, wherein the step of forming the third fan-out lines and the common electrodes comprises:
    forming a transparent conductive material layer, an auxiliary conductive material layer and a photoresist material layer in sequence;

patterning the photoresist material layer by using a photomask, thereby forming a photoresist layer, wherein the photoresist layer comprises:
  a plurality of first blocks disposed in the pixel region; and
  a plurality of second blocks disposed in the fan-out region, a thickness of each of the second blocks smaller than a thickness of each of the first blocks;
patterning the auxiliary conductive material layer by using the photoresist layer to form the auxiliary conductive layers in the fan-out region and a remaining auxiliary conductive material layer in the pixel region, wherein a portion of each of the auxiliary conductive layers is overlapped with both of the corresponding first fan-out line and the corresponding second fan-out line;
patterning the transparent conductive material layer by using the photoresist layer to form the transparent conductive layer in the fan-out region and the common electrodes in the pixel region;
removing the first blocks;
removing the remaining auxiliary conductive material layer; and
removing the second blocks.

3. The manufacturing method of the array substrate according to claim 1, wherein each of the transistors comprises a gate, a semiconductor layer, a source and a drain, wherein the gates, the scan lines and the first fan-out lines are formed by a same metal layer.

4. The manufacturing method of the array substrate according to claim 3, wherein the sources, the drains, the data lines and the second fan-out lines are formed by another same metal layer.

5. The manufacturing method of the array substrate according to claim 4, further comprising forming a plurality of touch signal lines to be respectively electrically connected to the corresponding common electrodes, wherein the touch signal lines, the sources, the drains, the data lines and the second fan-out lines are formed by the another same metal layer.

6. The manufacturing method of the array substrate according to claim 1, wherein the common electrodes and the transparent conductive layer are formed by a same conductive layer.

7. The manufacturing method of the array substrate according to claim 1, further comprising forming a plurality of first pads, a plurality of second pads and a plurality of third pads in the fan-out region, wherein each of the first pads is electrically connected to the corresponding first fan-out line, each of the second pads is electrically connected to the corresponding second fan-out line, and each of the third pads is electrically connected to the corresponding third fan-out line.

8. The manufacturing method of the array substrate according to claim 1, wherein each of the first fan-out lines, the second fan-out lines and the third fan-out lines has an extending portion, an extending direction of each of the extending portions is not parallel with an extending direction of each of the data lines, and portions of the extending portions of the first fan-out line, the second fan-out line and the third fan-out line adjacent to each other and arranged in sequence are completely overlapped with each other.

9. The manufacturing method of the array substrate according to claim 1, wherein each of the first fan-out lines, the second fan-out lines and the third fan-out lines has an extending portion, an extending direction of each of the extending portions is not parallel with an extending direction of each of the data lines, and the extending portions of the first fan-out line, the second fan-out line and the third fan-out line adjacent to each other and arranged in sequence are alternately overlapped with each other.

10. A manufacturing method of an array substrate, comprising:
  forming a first metal layer on a substrate having a pixel region and a fan-out region, wherein the first metal layer comprises a plurality of gates and a plurality of scan lines disposed in the pixel region and a plurality of first fan-out lines disposed in the fan-out region;
  forming a gate insulating layer on the first metal layer;
  forming a second metal layer on the gate insulating layer, the second metal layer comprising a plurality of sources, a plurality of drains and a plurality of data lines disposed in the pixel region and a plurality of second fan-out lines disposed in the fan-out region;
  forming a first insulating layer on the second metal layer; and
  forming a first conductive layer and a third metal layer on the first insulating layer by using a photomask, wherein the first conductive layer comprises a plurality of transparent conductive layers disposed in the fan-out region and a plurality of common electrodes disposed in the pixel region, the third metal layer comprises a plurality of auxiliary conductive layers disposed in the fan-out region, the auxiliary conductive layers are respectively disposed on the transparent conductive layers to constitute a plurality of third fan-out lines in the fan-out region.

11. The manufacturing method of the array substrate according to claim 10, wherein after the step of forming the first conductive layer and the third metal layer, the method further comprises:
  forming a second insulating layer on the first conductive layer and the third metal layer; and
  forming a second conductive layer on the second insulating layer, wherein the second conductive layer comprises:
    a plurality of pixel electrodes disposed in the pixel region and respectively electrically connected to the drains; and
    a plurality of bridge electrodes disposed in the fan-out region.

12. The manufacturing method of the array substrate according to claim 10, wherein the step of forming the first conductive layer and the third metal layer comprises:
  forming a transparent conductive material layer, an auxiliary conductive material layer and a photoresist material layer on the first insulating layer in sequence;
  patterning the photoresist material layer by using a photomask to form a photoresist layer, wherein the photoresist layer comprises:
    a plurality of first blocks disposed in the pixel region; and
    a plurality of second blocks disposed in the fan-out region, a thickness of each of the second blocks being greater than a thickness of each of the first blocks;
  patterning the auxiliary conductive material layer by using the photoresist layer to form the auxiliary conductive layers in the fan-out region and a remaining auxiliary conductive material layer in the pixel region, wherein a portion of each of the auxiliary conducive layers is overlapped with both of the corresponding first fan-out line and the corresponding second fan-out line;
  patterning the transparent conductive material layer by using the photoresist layer to form the transparent conductive layer in the fan-out region and the common electrodes in the pixel region;
removing the first blocks;
removing the remaining auxiliary conductive material layer; and
removing the second blocks.

13. The manufacturing method of the array substrate according to claim 10, further comprising:
forming a plurality of semiconductor layers on the gate insulating layer and respectively corresponding to the gates before the step of forming the second metal layer on the gate insulating layer; and
forming a plurality of first pads, a plurality of second pads and a plurality of third pads in the fan-out region, wherein each of the first pads is electrically connected to the corresponding first fan-out line, each of the second pads is electrically connected to the corresponding second fan-out line, and each of the third pads is electrically connected to the corresponding third fan-out line.

14. The manufacturing method of the array substrate according to claim 13, wherein each of the first fan-out lines, the second fan-out lines and the third fan-out lines has an extending portion, an extending direction of each of the extending portions is not parallel with an extending direction of each of the data lines, and the extending portions of the first fan-out line, the second fan-out line and the third fan-out line adjacent to each other and arranged in sequence are completely overlapped with each other.

15. The manufacturing method of the array substrate according to claim 13, wherein each of the first fan-out lines, the second fan-out lines and the third fan-out lines has an extending portion, an extending direction of each of the extending portions is not parallel with an extending direction of each of the data lines, and the extending portions of the first fan-out line, the second fan-out line and the third fan-out line adjacent to each other and arranged in sequence are alternately overlapped with each other.

* * * * *